(12) United States Patent
Chen et al.

(10) Patent No.: US 11,133,386 B2
(45) Date of Patent: Sep. 28, 2021

(54) MULTI-LAYER FIN STRUCTURE

(71) Applicant: Taiwan Semiconductor Manufacturing Co., Ltd., Hsin-Chu (TW)

(72) Inventors: Bwo-Ning Chen, Keelung (TW); Xusheng Wu, Hsinchu (TW); Chang-Miao Liu, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/735,379

(22) Filed: Jan. 6, 2020

(65) Prior Publication Data

US 2021/0066457 A1 Mar. 4, 2021

Related U.S. Application Data

(60) Provisional application No. 62/892,064, filed on Aug. 27, 2019.

(51) Int. Cl.
| | |
|---|---|
| *H01L 29/10* | (2006.01) |
| *H01L 27/092* | (2006.01) |
| *H01L 29/78* | (2006.01) |
| *H01L 29/161* | (2006.01) |
| *H01L 29/66* | (2006.01) |
| *H01L 21/8238* | (2006.01) |

(Continued)

(52) U.S. Cl.
CPC .... *H01L 29/1054* (2013.01); *H01L 21/02532* (2013.01); *H01L 21/26513* (2013.01); *H01L 21/823807* (2013.01); *H01L 21/823821* (2013.01); *H01L 27/0924* (2013.01); *H01L 29/161* (2013.01); *H01L 29/66537* (2013.01); *H01L 29/66795* (2013.01); *H01L 29/7851* (2013.01)

(58) Field of Classification Search
CPC ............ H01L 29/1054; H01L 29/7851; H01L 29/161; H01L 29/66795; H01L 29/66537; H01L 29/785; H01L 29/0847; H01L 29/66545; H01L 29/7848; H01L 29/165; H01L 27/0924; H01L 21/823807; H01L 21/02532; H01L 21/26513; H01L 21/823821
USPC ............... 257/369, 337, 335, 401, 408, 192, 257/E21.09, E21.092, E21.097, E21.103, 257/E21.132, E29.255, E29.267, E29.298; 438/157, 197, 283, 300, 478
See application file for complete search history.

(56) References Cited

U.S. PATENT DOCUMENTS

| | | | |
|---|---|---|---|
| 8,796,666 B1 | 8/2014 | Huang et al. | |
| 8,815,712 B2 * | 8/2014 | Wan ................... | H01L 21/02532 438/478 |

(Continued)

*Primary Examiner* — Dao H Nguyen
(74) *Attorney, Agent, or Firm* — Haynes and Boone, LLP

(57) ABSTRACT

The present disclosure provides one embodiment of a semiconductor structure. The structure includes a semiconductor substrate; a fin extending above the semiconductor substrate, wherein the fin includes a first layer over the semiconductor substrate and a second layer over the first layer, wherein the first layer includes silicon germanium having a first concentration of germanium, and wherein the second layer includes silicon germanium having a second concentration of germanium less than the first concentration of germanium; and a gate stack disposed over the fin.

20 Claims, 17 Drawing Sheets

(51) Int. Cl.
    *H01L 21/02*    (2006.01)
    *H01L 21/265*   (2006.01)

(56) References Cited

U.S. PATENT DOCUMENTS

| | | |
|---|---|---|
| 8,836,016 B2 | 9/2014 | Wu et al. |
| 8,841,701 B2 | 9/2014 | Lin et al. |
| 8,847,293 B2 | 9/2014 | Lee et al. |
| 8,853,025 B2 | 10/2014 | Zhang et al. |
| 8,962,400 B2 | 2/2015 | Tsai et al. |
| 8,963,258 B2 | 2/2015 | Yu et al. |
| 9,093,514 B2 | 7/2015 | Tsai et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,245,805 B2 | 1/2016 | Yeh et al. |
| 9,520,482 B1 | 12/2016 | Chang et al. |
| 9,548,303 B2 | 1/2017 | Lee et al. |
| 9,576,814 B2 | 2/2017 | Wu et al. |
| 10,141,430 B1 * | 11/2018 | Fung ................... H01L 29/161 |
| 2013/0285116 A1 | 10/2013 | Lochtefeld et al. |
| 2015/0303118 A1 * | 10/2015 | Wang ............ H01L 21/823431 257/401 |
| 2018/0151698 A1 * | 5/2018 | Sung .................. H01L 21/3065 |
| 2018/0254344 A1 * | 9/2018 | Cheng .............. H01L 29/78642 |

* cited by examiner

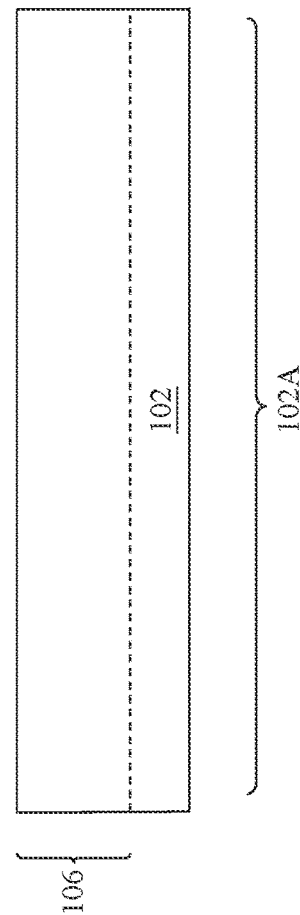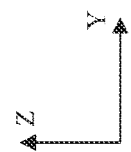

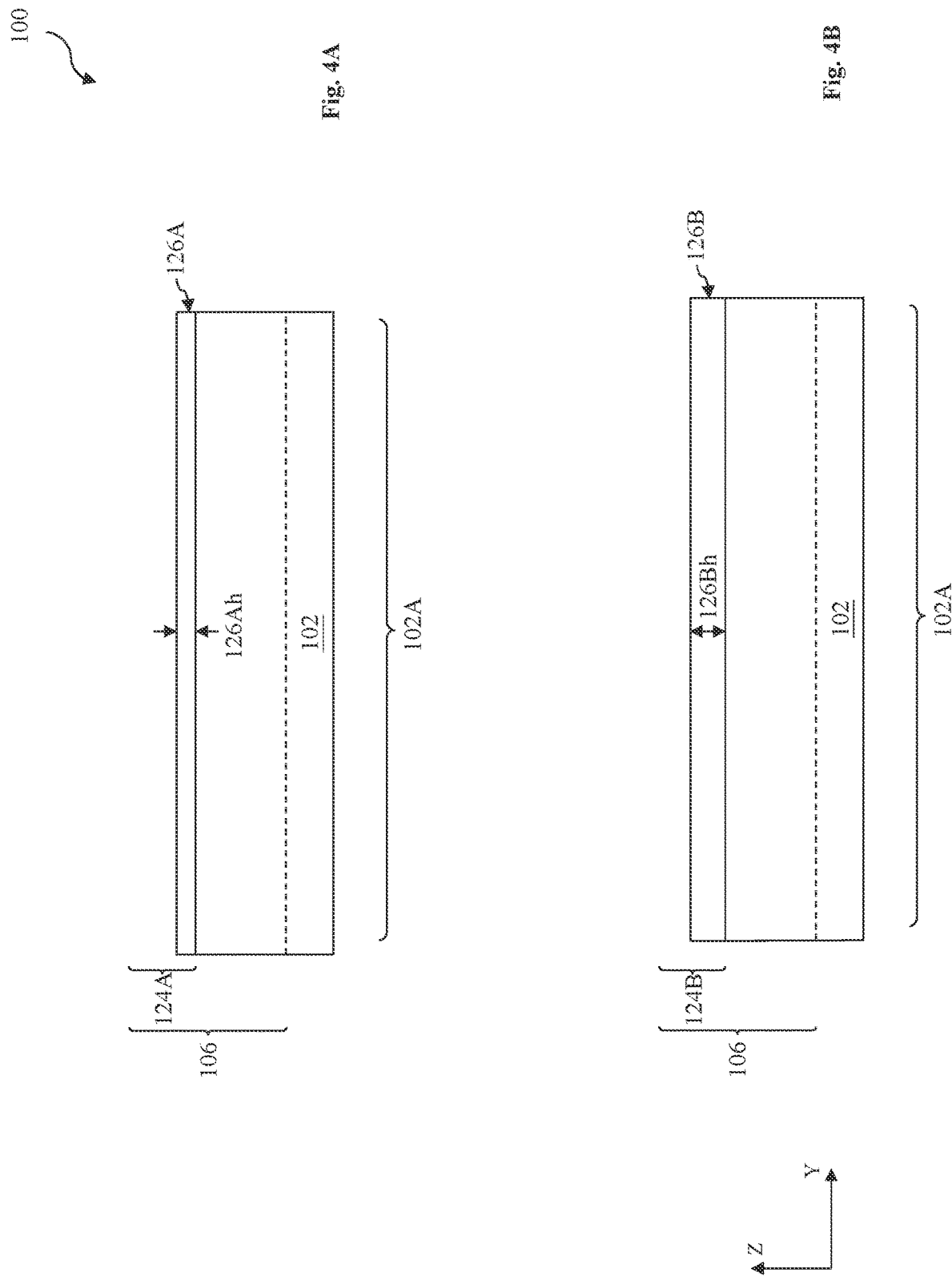

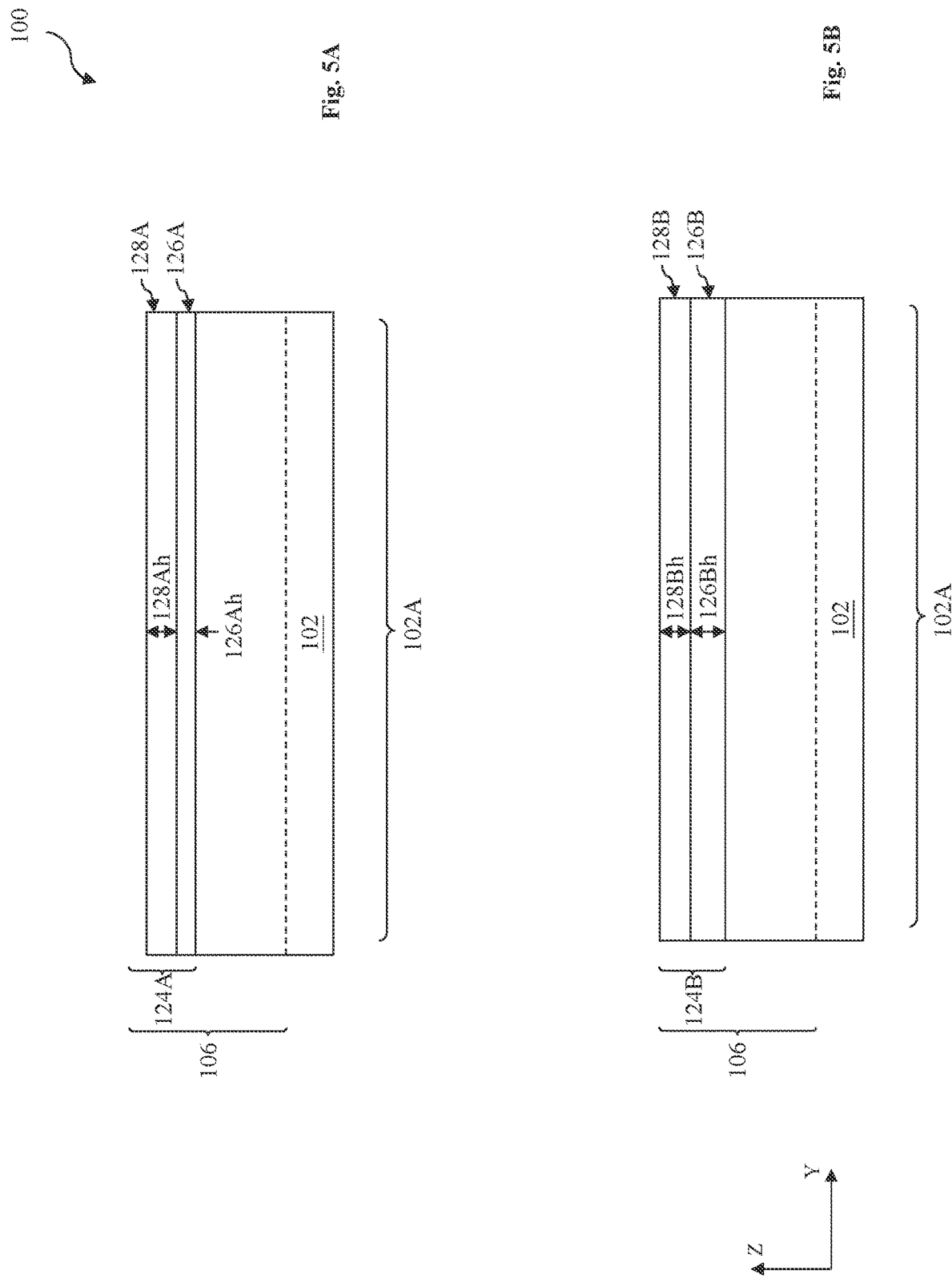

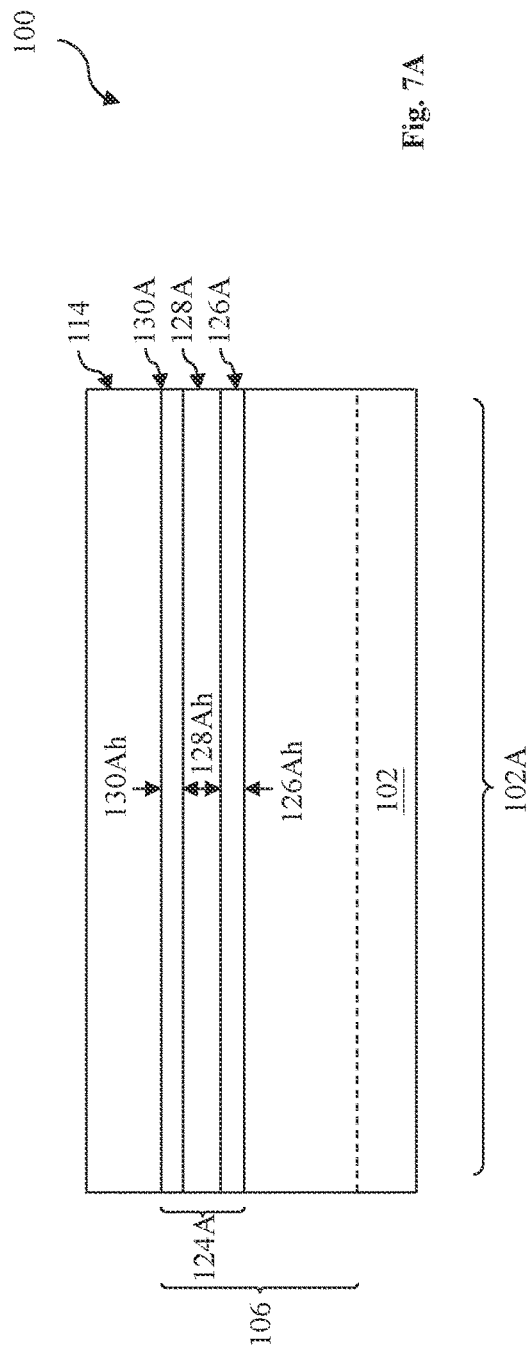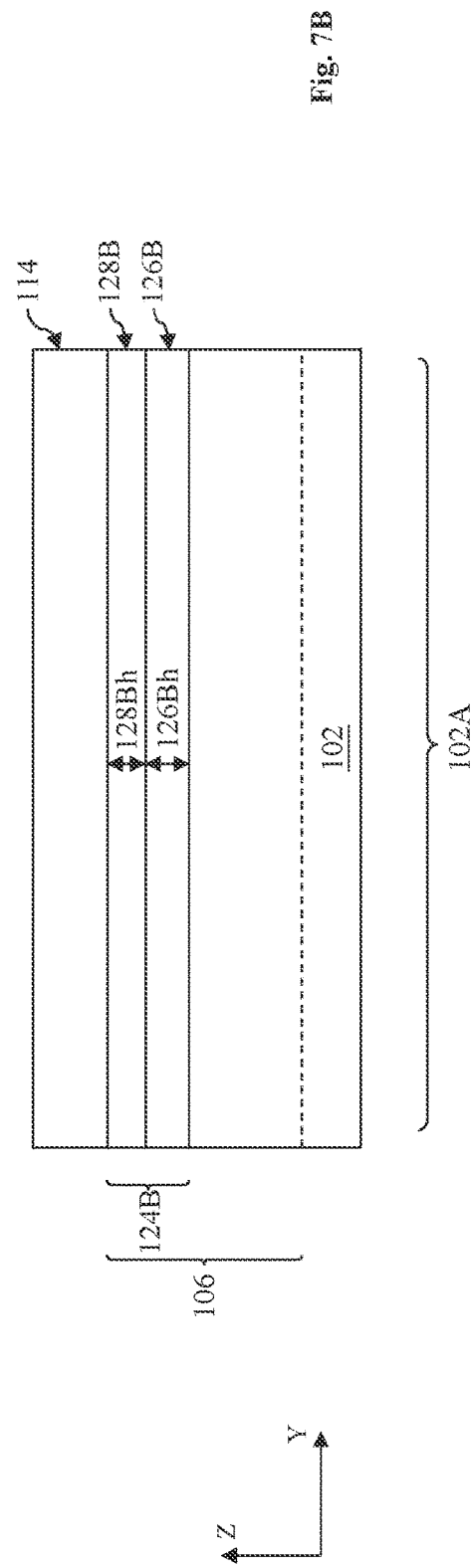

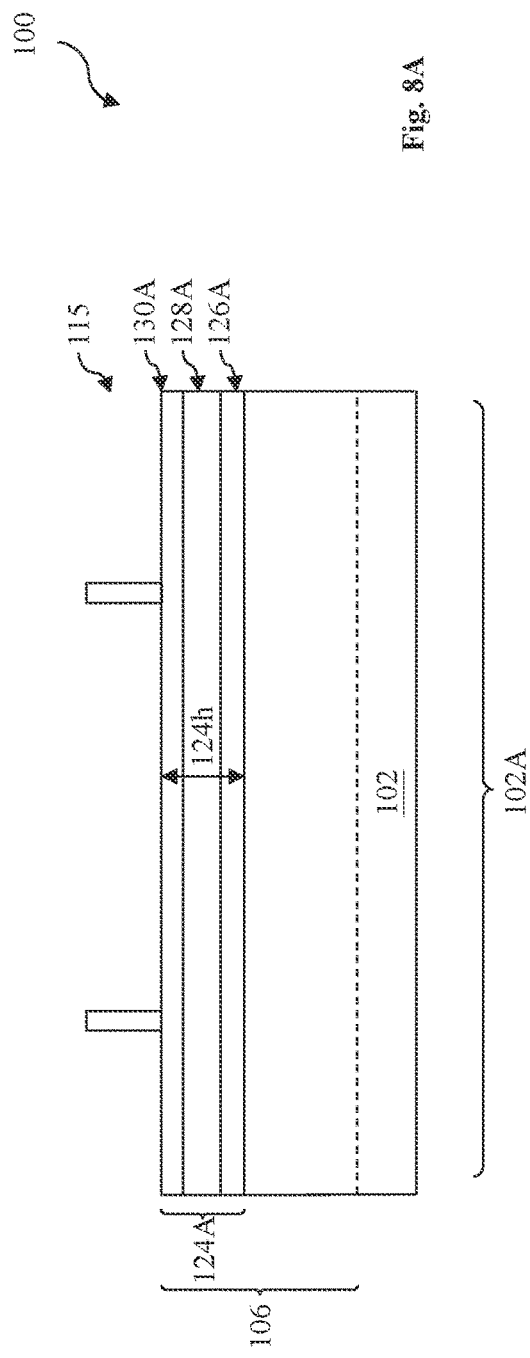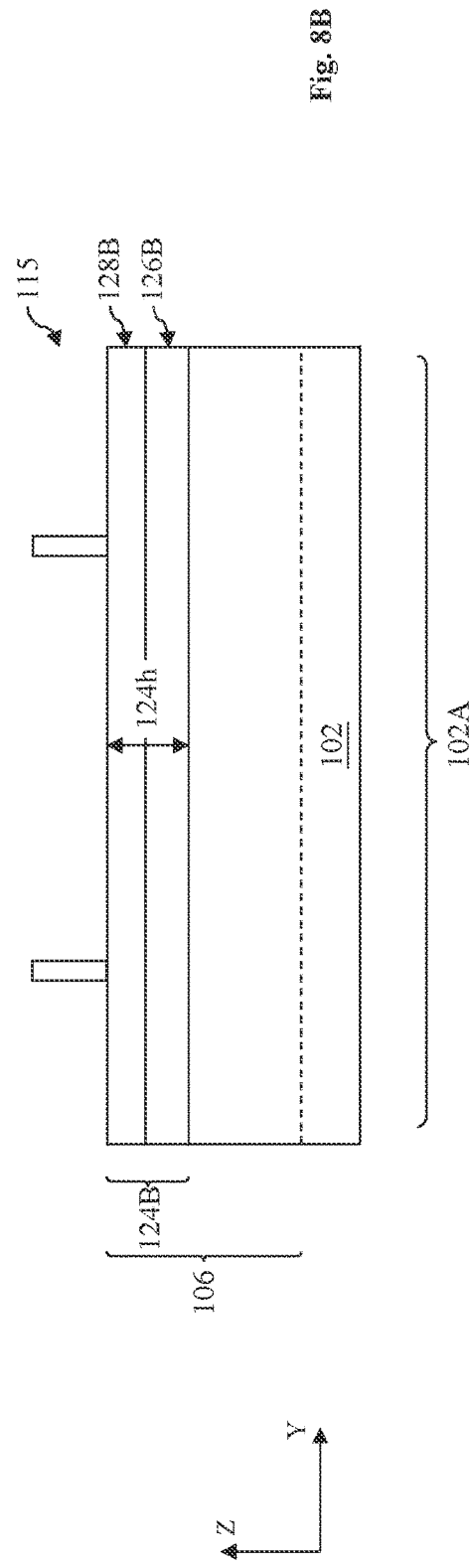

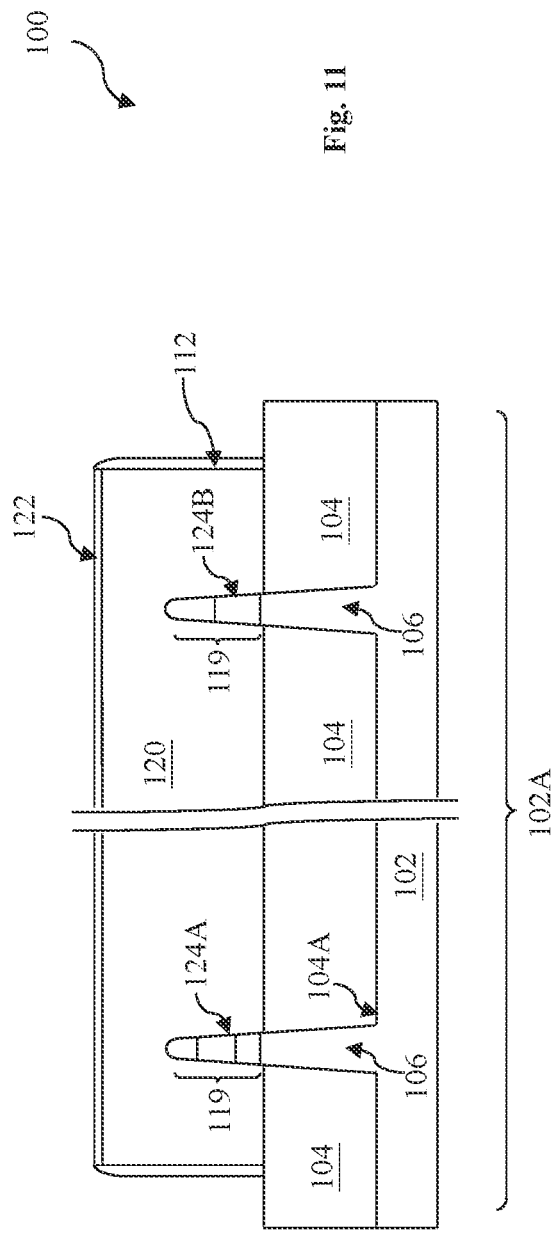
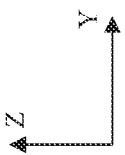

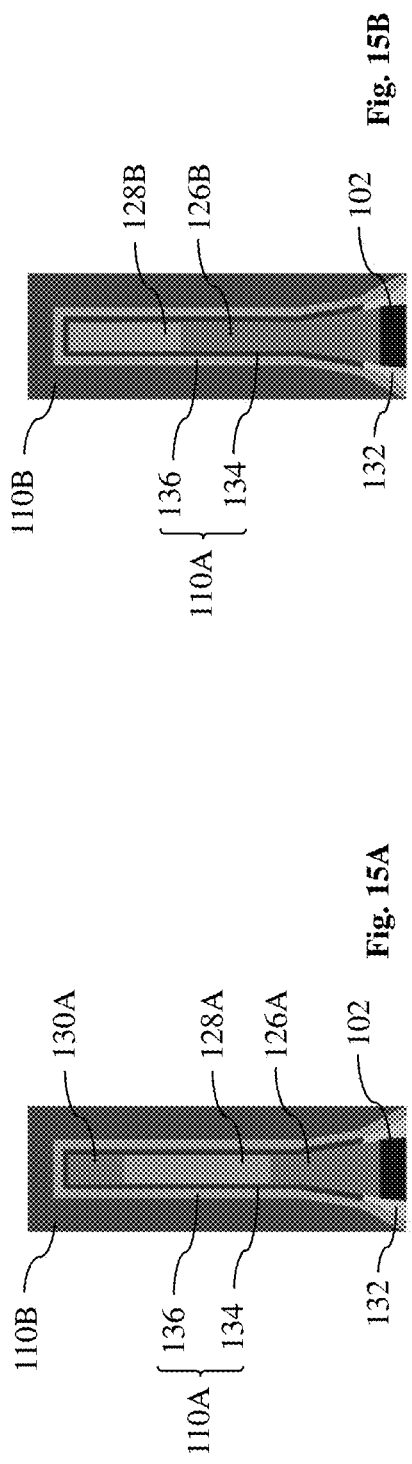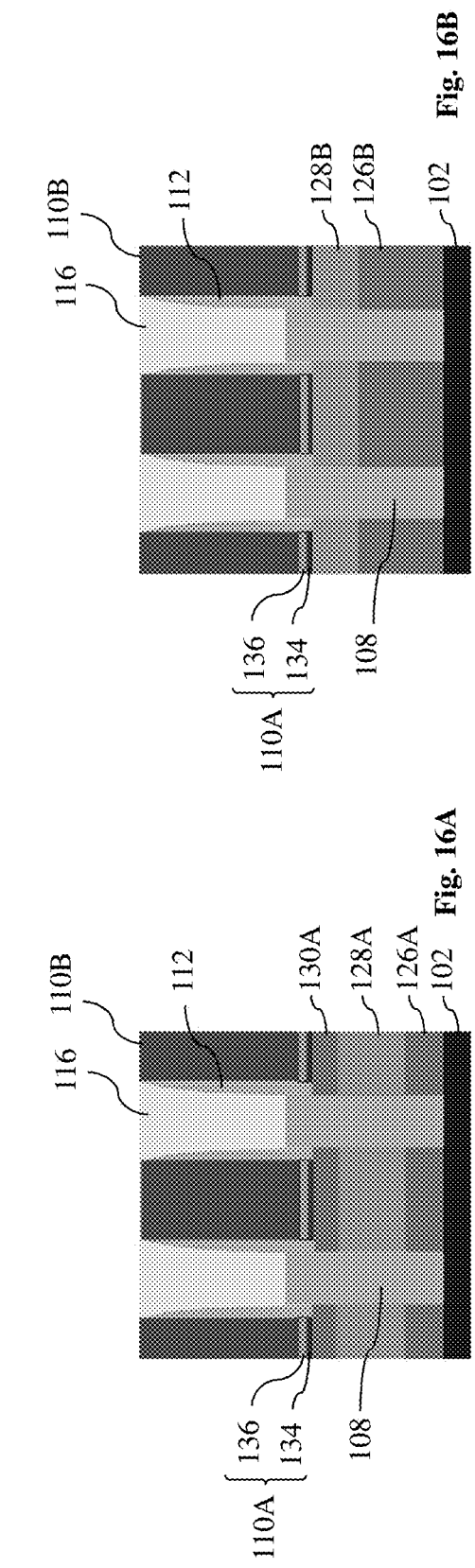

MULTI-LAYER FIN STRUCTURE

PRIORITY DATA

The present application claims the benefit of U.S. Provisional Application No. 62/892,064, entitled "Multi-Layer FIN Structure," filed Aug. 27, 2019, herein incorporated by reference in its entirety.

RELATED PATENT APPLICATION

This application is related to the following: Ser. No. 16/414,565, filing date May 16, 2019, which is assigned to a common assignee and herein incorporated by reference in its entirety.

BACKGROUND

Integrated circuits have progressed to advanced technologies with smaller feature sizes, such as 16 nm, 10 nm, 7 nm, and 5 nm. In these advanced technologies, the devices (such as transistors) shrink and therefore induce various issues, such as contact to gate bridging concern. Furthermore, three dimensional transistors with fin active regions are often desired for enhanced device performance. Those three-dimensional field effect transistors (FETs) formed on fin active regions are also referred to as FinFETs. The FinFETs are desired to have narrow fin width for short channel control, which leads to high aspect ratio of the fin active regions. Accordingly, the fin active regions may have non-uniform distribution of threshold voltage (Vt) due to MG or S/D profile design and dimension effect that degrades the device performance. Furthermore, the fin active regions may have non-uniform on-state current distribution with higher current crowding risk. Furthermore, the fin active regions may have higher Vt at fin top, higher Vt with smaller fin width, and/or higher Vt with larger channel length. Therefore, there is a need for a device structure and a method for fin transistors to address these concerns for enhanced circuit performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 3, 4A, 4B, 5A, 5B, 6A, 7A, 7B, 8A, 8B, 9A, 9B, 9C, 10, and 11 are side section views of a semiconductor structure at various fabrication stages constructed according to various embodiments.

FIGS. 15A and 15B are side section views along line AA' of the semiconductor structure of FIG. 14 constructed according to some embodiments.

FIGS. 16A and 16B are side section views along line BB' of the semiconductor structure of FIG. 14 constructed according to some embodiments.

DETAILED DESCRIPTION

Figure 1A:
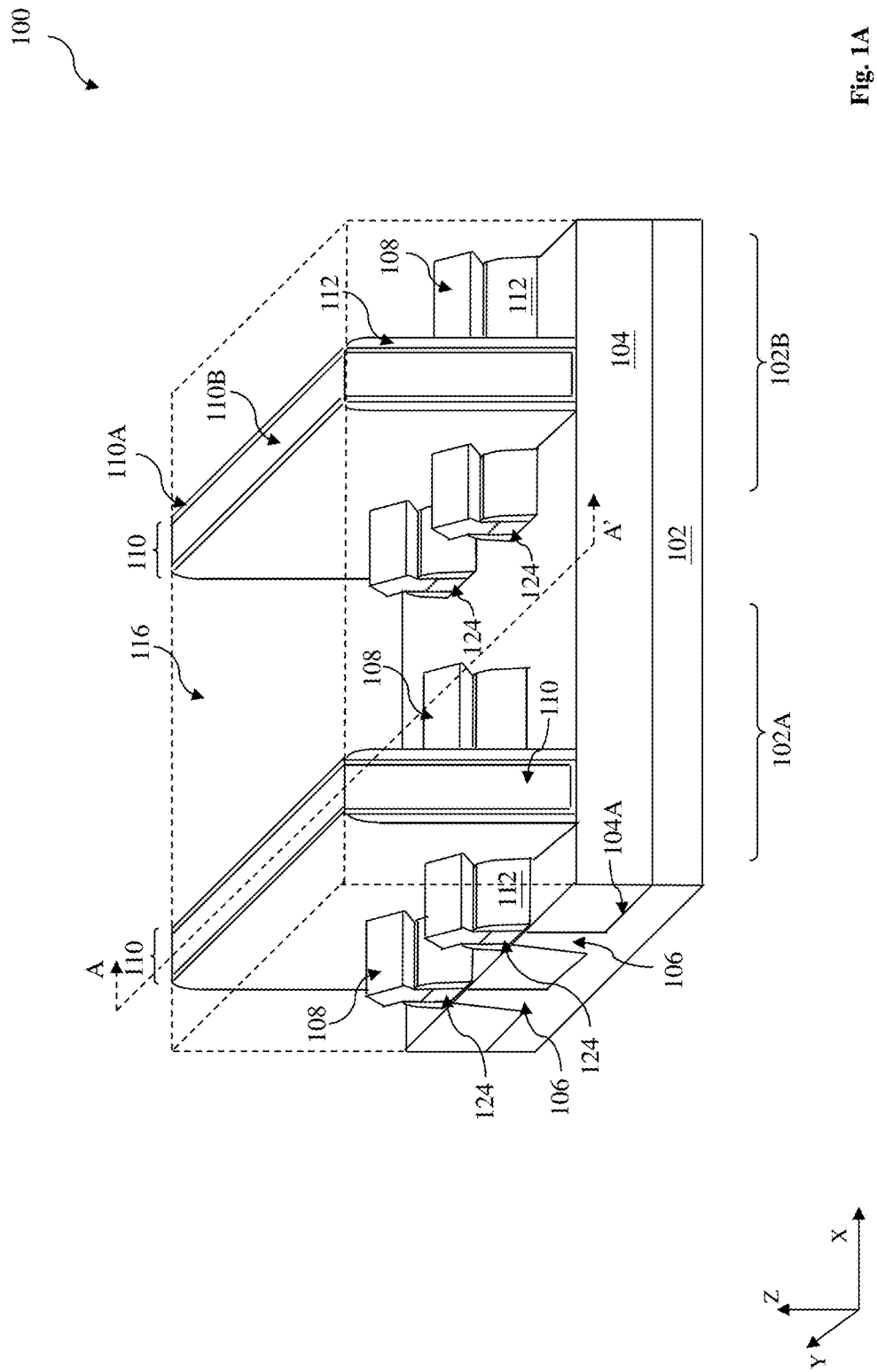
FIG. 1A is a perspective view of a semiconductor structure constructed according to various embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Figure 1B:
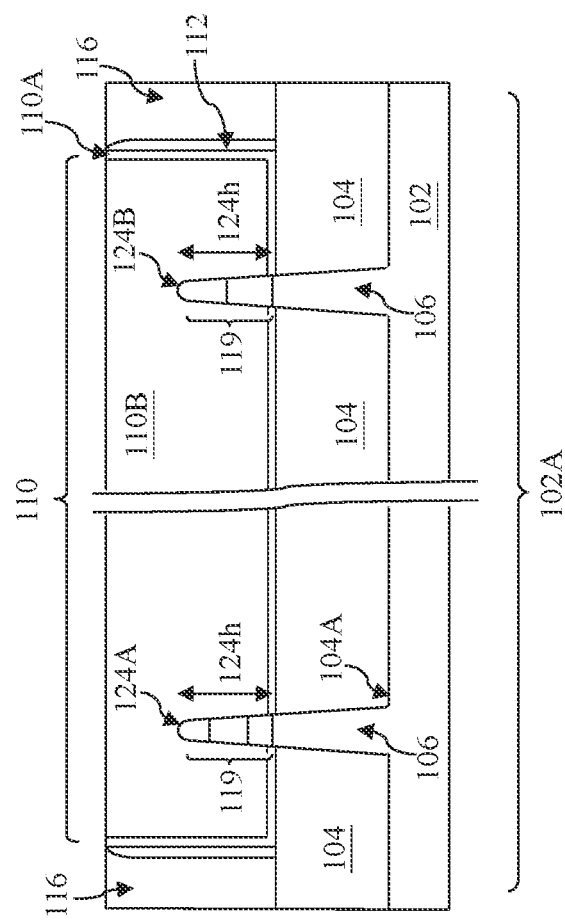
FIG. 1B is a side section view along line AA' of the semiconductor structure of FIG. 1A constructed according to various embodiments.
Figure 2:
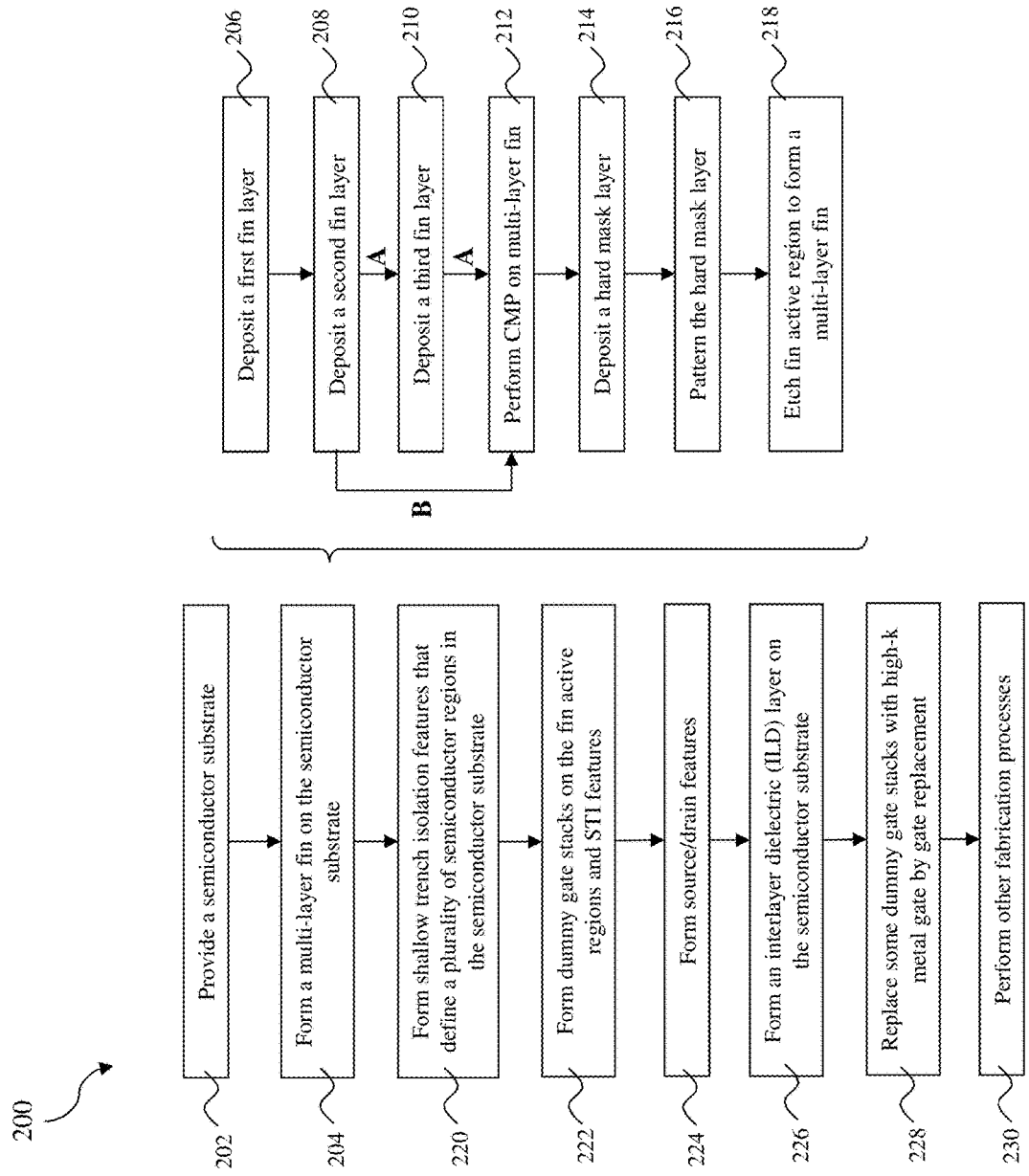
FIG. 2 is a flowchart of a method of making a semiconductor structure constructed according to various aspects of the present disclosure in some embodiments.

The present disclosure provides a structure and a method of making the same to address the threshold voltage (Vt) distribution and current density issue. FIG. 1A is a perspective view of a semiconductor structure 100 and FIG. 1B is a side section view of the semiconductor structure 100 along the dashed line AA', constructed in accordance with some embodiments. The semiconductor structure 100 includes a semiconductor substrate 102 with various field effect transistors (FETs) formed thereon. Particularly, the semiconductor structure 100 includes a first region 102A with p-type FETs (pFETs) formed thereon and a second region 102B with n-type FETs (nFETs) formed thereon. FIG. 2 is a flowchart of a method 200 of making a semiconductor structure, such as the semiconductor structure 100, in accordance with some embodiments. FIGS. 3 through 16 are perspective or side section views of the semiconductor structure 100 at various fabrication stages in accordance with some embodiments. The semiconductor structure 100 and the method 200 of making the same are collectively described below with reference to FIGS. 1 through 16.

Referring to FIGS. 1A and 1B, the semiconductor structure 100 includes a semiconductor substrate 102 having a first region 102A for pFETs and a second region 102B for nFETs. The semiconductor structure 100 includes various isolation features 104, such as shallow trench isolation (STI) features. The semiconductor structure 100 also includes various fin active regions 106 formed on the semiconductor substrate 102. The fin active regions 106 are extruded above the isolation features 104 and are surrounded and isolated from each other by the isolation features 104. Various FinFETs are formed on the fin active regions 106. In the present embodiments, pFETs are disposed on the fin active regions 106 within the first region 102A and nFETs are disposed on the fin active regions 106 within the second region 102B. Sources and drains (S/Ds) 108 are formed on the fin active regions 106, and gate stacks 110 are formed on the fin active regions 106 and disposed between the corresponding S/D 108. Each of the gate stacks 110 includes a gate dielectric layer 110A and a gate electrode 110B. Spacers 112 may be further formed on sidewalls of the gate stacks 110 and sidewalls of the fin active regions 106 as well. A channel 119 is a portion of a fin active region 106 underlying the corresponding gate stack 110. The corresponding S/D 108; the gate stack 110; and the channel 119 are coupled to a FET. In the present example illustrated in FIGS. 1A and 1B, the first region 102A includes two pFETs and the second region 102B includes two nFETs.

The semiconductor structure 100 further includes an interlayer dielectric (ILD) layer 116 disposed on the fin active regions 106 and surrounding the gate stacks 110. The ILD layer 116 in FIG. 1A is drawn in dashed lines and is illustrated as being transparent to have better viewing of various features, such as gate stacks 110 and the fin active regions 106. Since the fin active regions 106 are extruded above the isolation features 104, the gate stacks 110 are coupled to the corresponding channel 119 more effectively through sidewalls and top surface of the fin active region 106, therefore enhancing the device performance.

Referring specifically to FIG. 1B, the fin active region 106 includes a multi-layer fin structure 124 disposed in the channel 119. The multi-layer fin structure 124 has a total height 124h in the channel 119. In some embodiments, the total height 124h may be about 30-100 nm. In one or more embodiments, the fin structure 124 includes a tri-layer fin 124A. The tri-layer fin 124A is so-called because of having three distinct stacked fin layers disposed in the channel 119 with each layer having a different chemical composition than each adjacent layer. In some other embodiments, the multi-layer fin structure 124 includes a bi-layer fin 124B. The bi-layer fin 124B is so-called because of having two distinct stacked fin layers disposed in the channel 119 with each layer having a different chemical composition than each adjacent layer. In FIG. 1B, the tri-layer fin 124A and the bi-layer fin 124B are shown side-by-side for illustration purposes only and to facilitate understanding. This is not intended to be limiting beyond what is specifically recited in the claims that follow. It will be appreciated that the tri-layer fin 124A and the bi-layer fin 124B may be used separately or in combination with each other. In particular, the break line depicted in FIG. 1B indicates right and left sides of semiconductor structure 100 may not be connected to each other.

Referring to FIG. 2, the semiconductor structure 100 is formed by the method 200. The semiconductor structure 100, especially the multi-layer fin structure 124, and the method 200 are further described below in detail. By implementing the semiconductor structure 100 and the method 200 of making the same, the threshold voltage (Vt) distribution and current density issue is eliminated or reduced. Furthermore, current at saturation mode is increased, achieving DC gain without AC penalty. Furthermore, drain-induced barrier lowering (DIBL) is reduced from improvement in Vt uniformity. Furthermore, wafer acceptance test (WAT) and technology computer-aided design (TCAD) show DC+>1% without degrading line-end roughness (LER) and total interface trap density ($D_{it}$). Furthermore, bottom off current (Ibof) increase penalty and Vt shift are avoided. In some embodiments, improving Vt uniformity may include reducing a difference between local Vt and total Vt in one or more layers of the multi-layer fin 124. In some embodiments, improving Vt uniformity may include reducing an average difference or cumulative difference between local Vt and total Vt of the multi-layer fin 124. Improving Vt uniformity in accordance with some embodiments may improve device performance by 2% or more.

Issues with uneven Vt distribution were observed and determined for FinFET devices. More particularly, Vt continuously varied from top to bottom of fins. In some examples, local Vt was greatest at fin top and bottom having associated lowest current density at fin top and bottom. In such examples, local Vt decreased to a lowest Vt value near a middle of the fin having associated highest current density near the middle of the fin. High Vt at fin top may result from S/D proximity, tri-gate structure and thinner fin profile at fin top. Through experimentation, structures and methods were discovered to address Vt distribution issues without increasing cost. For instance, the semiconductor structure 100 and the method 200 of making the same offers enhanced tunability of multi-layer fin 124 composition. In some embodiments, multi-layer fins 124 may be formed by epitaxial growth using a gas flow having a dopant containing chemical, such as phosphorus for n-type or boron for p-type. In some embodiments, dopant concentration may be tuned through control of gas flow and/or partial pressure in epitaxial growth process, such as using CVD reaction chamber. In some implementations, gas flow rate and/or partial pressure of the dopant containing chemical may be changed for each layer of a tri-layer 124A or bi-layer 124B fin. In some other implementations, gas flow rate and/or partial pressure of the dopant containing chemical may be continuously changed to create a continuous dopant concentration gradient along the fin. In any case, composition of multi-layer fins 124 may be tuned by only changing a recipe in an epitaxial growth process thereby improving Vt uniformity without increasing process cost.

Referring to FIG. 3, the method 200 begins at block 202 by providing a semiconductor substrate 102. In some embodiments, the semiconductor substrate 102 includes silicon. In some other embodiments, the substrate 102 may include germanium, silicon germanium or other proper semiconductor materials. The substrate 102 may alternatively be made of some other suitable elementary semiconductor, such as diamond or germanium; a suitable compound semiconductor, such as silicon germanium, silicon carbide, gallium arsenic, indium arsenide, or indium phosphide; or a suitable alloy semiconductor, such as silicon germanium carbide, gallium arsenic phosphide, or gallium indium phosphide.

The semiconductor substrate 102 may also include various doped regions such as n-wells and p-wells. In some embodiments, the semiconductor substrate 102 may include a buried dielectric material layer for isolation formed by a proper technology, such as a technology referred to as separation by implanted oxygen (SIMOX).

The semiconductor substrate 102 may be uniform in composition or may include various layers. The layers may have similar or different compositions, and in various embodiments, some substrate layers have non-uniform compositions to induce device strain and thereby tune device performance. The semiconductor substrate 102 may include an epitaxial layer formed on the top surface, such as an epitaxial semiconductor layer overlying a bulk semiconductor wafer. In various embodiments, the semiconductor substrate 102 includes one or more epitaxially grown semiconductor material. For example, a silicon layer is epitaxially grown on a silicon wafer. In another example, a silicon germanium layer is epitaxially grown on a silicon wafer. In yet another example, silicon and silicon germanium are alternatively epitaxially grown on a silicon wafer. In some embodiments, suitable deposition processes for epitaxy growth include atomic layer deposition (ALD), chemical vapor deposition (CVD), high-density plasma CVD (HDP-CVD), physical vapor deposition (PVD) and/or other suitable deposition processes. Any of these techniques may be used to grow the semiconductor layer having any composition including a graded composition.

In the present embodiment, the substrate 102 includes a fin active region 106. In some embodiments, the fin active region 106 is formed with the substrate 102 and is identical to the substrate 102. In some other embodiments, the fin active region 106 may be formed independently of the substrate 102 and may have a different composition than the substrate 102.

Referring to FIG. 4A, the method 200 proceeds to an operation 204 by forming a multi-layer fin structure 124 on the semiconductor substrate 102 in both the first region 102A for pFETs and the second region 102B for nFETs.

Referring more particularly to FIG. 4A, the method 200 proceeds to an operation 206 by depositing a first fin layer 126A on the semiconductor substrate 102. In some embodiments, the first fin layer 126A may be epitaxially grown. In some embodiments, suitable deposition processes for epitaxy growth include ALD, CVD, HDP-CVD, PVD, and other suitable deposition processes. The first fin layer 126A may incorporate proper semiconductor materials including those disclosed for semiconductor substrate 102 without limitation. The first fin layer 126A has a height 126Ah in the channel 119. In some embodiments, the height 126Ah may be 25-35% of the total height 124$h$. In some embodiments, the height 126Ah may be about 7.5-35 nm. In some embodiments, the first fin layer 126A may include a compound semiconductor having formula Si-X, such as silicon germanium. The first fin layer 126A may have X-concentration 126Ac. In some embodiments, other useful compound semiconductors may have formula Y-X, where Y may include, without limitation, Si, Ga, and In, and where X may include, without limitation, Ge, C, As, and P.

Referring to FIG. 4B, another embodiment of the semiconductor structure 100 is illustrated. In this embodiment, the method 200 proceeds to an operation 206 by depositing a first fin layer 126B on the semiconductor substrate 102. In some embodiments, the first fin layer 126B may be epitaxially grown. In some embodiments, suitable deposition processes for epitaxy growth include ALD, CVD, HDP-CVD, PVD, and other suitable deposition processes. The first fin layer 126B may incorporate proper semiconductor materials including those disclosed for semiconductor substrate 102 without limitation. The first fin layer 126B has a height 126Bh in the channel 119. In some embodiments, the height 126Bh may be 30-60% of the total height 124$h$. In some embodiments, the height 126Bh may be about 9-60 nm. In some embodiments, the first fin layer 126B may include a compound semiconductor having formula Si-X, such as silicon germanium. The first fin layer 126B may have X-concentration 126Bc. In some embodiments, other useful compound semiconductors may have formula Y-X, where Y may include, without limitation, Si, Ga, and In, and where X may include, without limitation, Ge, C, As, and P.

Referring to FIG. 5A, the method 200 proceeds to an operation 208 by depositing a second fin layer 128A on the first fin layer 126A. In some embodiments, the second fin layer 128A may be epitaxially grown using a different recipe than the first fin layer 126A. In some embodiments, suitable deposition processes for epitaxy growth include ALD, CVD, HDP-CVD, PVD, and other suitable deposition processes. The second fin layer 128A may incorporate proper semiconductor materials including those disclosed for semiconductor substrate 102 without limitation. The second fin layer 128A has a height 128Ah in the channel 119. In some embodiments, the height 128Ah may be 40-60% of the total height 124$h$. In some embodiments, the height 128Ah may be about 12-60 nm. In some embodiments, the second fin layer 128A may include a compound semiconductor having formula Si-X, such as silicon germanium. The second fin layer 128A may have X-concentration 128Ac. In some embodiments, other useful compound semiconductors may have formula Y-X, where Y may include, without limitation, Si, Ga, and In, and where X may include, without limitation, Ge, C, As, and P.

Referring to FIG. 5B, another embodiment of the semiconductor structure 100 is illustrated. In this embodiment, the method 200 proceeds to an operation 208 by depositing a second fin layer 128B on the first fin layer 126B. In some embodiments, the second fin layer 128B may be epitaxially grown using a different recipe than the first fin layer 126B. In some embodiments, suitable deposition processes for epitaxy growth include ALD, CVD, HDP-CVD, PVD, and other suitable deposition processes. The second fin layer 128B may incorporate proper semiconductor materials including those disclosed for semiconductor substrate 102 without limitation. The second fin layer 128B has a height 128Bh in the channel 119. In some embodiments, the height 128Bh may be 40-70% of the total height 124$h$. In some embodiments, the height 128Bh may be about 12-70 nm. In some embodiments, the second fin layer 128B may include a compound semiconductor having formula Si-X, such as silicon germanium. The second fin layer 128B may have X-concentration 128Bc. In some embodiments, other useful compound semiconductors may have formula Y-X, where Y may include, without limitation, Si, Ga, and In, and where X may include, without limitation, Ge, C, As, and P. In some embodiments, the first fin layer 126B may have a first dopant different than a second dopant of the second fin layer 128B. In some embodiments, the first fin layer 126B may have a first carrier concentration less than a second carrier concentration of the second fin layer 128B.

Referring still to FIG. 5B, the method 200 proceeds to an operation 212 by performing a chemical mechanical planarization/polishing (CMP) on the bi-layer fin 124B. The CMP process may remove excessive material from second fin layer 128B and planarize a top surface of the bi-layer fin 124B.

Figure 6A:
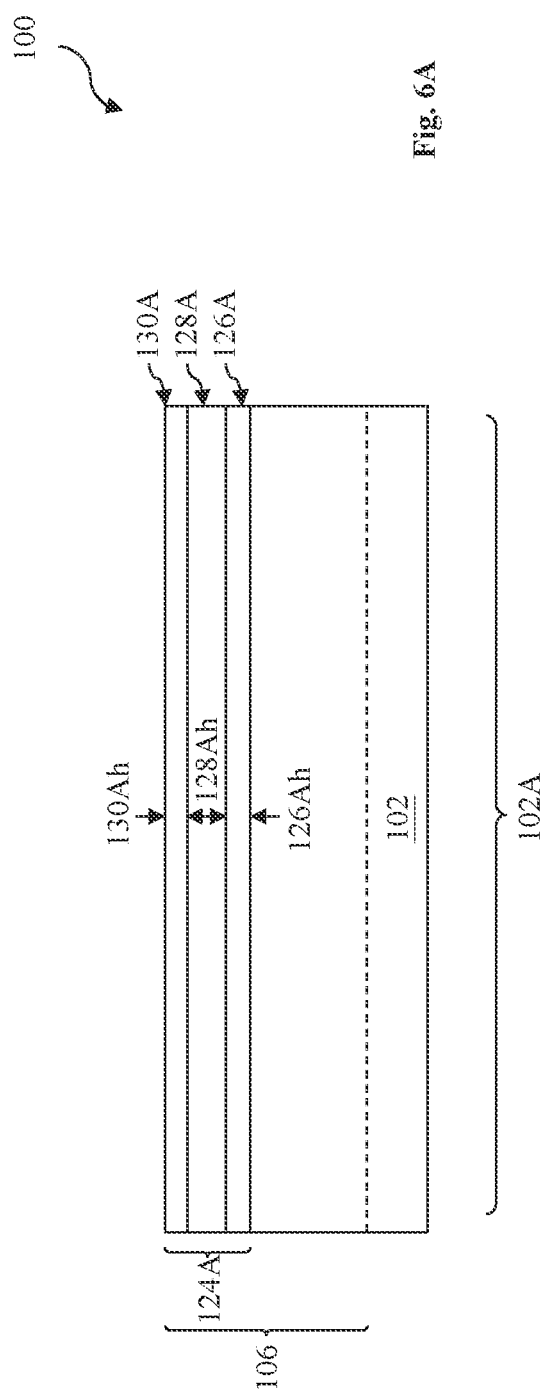

Referring to FIG. 6A, the method 200 proceeds to an operation 210 by depositing a third fin layer 130A on the second fin layer 128A. In some embodiments, the third fin layer 130A may be epitaxially grown using a different recipe than either of the first and second fin layers 126A, 128A. In some embodiments, suitable deposition processes for epitaxy growth include ALD, CVD, HDP-CVD, PVD, and other suitable deposition processes. The third fin layer 130A may incorporate proper semiconductor materials including those disclosed for semiconductor substrate 102 without limitation. The third fin layer 130A has a height 130Ah in the channel 119. In some embodiments, the height 130Ah may be 15-25% of the total height 124h. In some embodiments, the height 130Ah may be about 4.5-25 nm. In some embodiments, the third fin layer 130A may include a compound semiconductor having formula Si-X, such as silicon germanium. The third fin layer 130A may have X-concentration 130Ac. In some embodiments, other useful compound semiconductors may have formula Y-X, where Y may include, without limitation, Si, Ga, and In, and where X may include, without limitation, Ge, C, As, and P. In some embodiments, the third fin layer 130A and the first fin layer 126A may have a first dopant different than a second dopant of the second fin layer 128A. In some embodiments, each of the first and third fin layers 126A, 130A may have a first carrier concentration less than a second carrier concentration of the second fin layer 128A.

In some embodiments, the concentrations 128Ac and 128Bc may be about 10-30% germanium. Regarding the tri-layer fin 124A, in some embodiments, the concentrations 126Ac and 130Ac may exceed the concentration 128Ac by about 3-5%. Regarding the bi-layer fin 124B, in some embodiments, the concentration 126Bc may exceed the concentration 128Bc by about 3-5%. In some embodiments, the concentrations 128Ac and 128Bc may be about 10-30% germanium, and the concentrations 126Ac, 126Bc, and 130Ac may be about 13-35% germanium. In some embodiments, the concentrations 126Ac and 130Ac may be substantially equal to each other. In some embodiments, the concentrations 126Ac and 130Ac may be within 1% of each other.

Based on experimentation, it has been determined that the foregoing concentrations and compositions described with reference to the tri-layer fin 124A and bi-layer fin 124B are critical to addressing the Vt distribution and current density issue. Specifically, regarding the tri-layer fin 124A, increasing germanium concentration in the first and third layers 126A, 130A by 3-5% above germanium concentration in the second layer 128A resulted in improved Vt distribution and current density uniformity. Increasing germanium concentration may cause a decrease in Vt since silicon and germanium have different work functions (and different electron affinity and energy gap) with SiGe having a work function between silicon and germanium. Such a decrease in Vt from increased germanium content can improve Vt distribution relative to portions of a single-layer fin having Vt-Local greater than Vt-Total. This effect is described in greater detail below in reference to FIGS. 17A-17C.

In some embodiments, the multi-layer fin 124 may include four or more layers. Additional layers may improve fine tuning of Vt uniformity. In some embodiments, the multi-layer fin 124 may include gradients in composition and/or concentration between and/or within layers. In some embodiments, the multi-layer fin 124 may include a dopant, including without limitation Si, Ge, As, P, B, H, C, or combinations thereof. In some embodiments, one or more layers in an nFET may include SiC or Si doped with phosphorous, while one or more layers in a pFET may include Ge or SiGe doped with boron. In some embodiments, C or P doping of nFET may provide tuning of Vt. In some embodiments, one or more layers may include different dopants. In some embodiments, the layers may be in-situ doped. In some other embodiments, layers may be treated by ion implantation to introduce dopant. Selection of dopant type and concentration may enable tuning of Vt. In some embodiments, layers of the multi-layer fin 124 may be deposited by processes, including without limitation epitaxial growth (Epi), chemical vapor deposition (CVD), physical vapor deposition (PVD), and atomic layer deposition (ALD). In some embodiments, the layers may include silicon-containing compound semiconductors including one or more dopants or elements at different concentrations in each layer. In some embodiments, the channel structure may be a different structure than illustrated, including without limitation a planar, multi-gate, gate-all-around (GAA), Omega-gate (Ω-gate), or Pi-gate (Π-gate) device. In some embodiments, the fin profile and S/D design may enable further performance enhancement. In some embodiments, reducing a thickness of a top fin layer 128B, 130A adjacent tri-gate may increase Vt and degrade Vt uniformity. In some embodiments, increasing a thickness of a top fin layer 128B, 130A may reduce Vt and improve Vt uniformity.

Foregoing designs of tri-layer 124A and bi-layer 124B fins including relative heights of various layers, compositions, and dopant concentrations were determined by experimentation to result in greater Vt and current density uniformity in accordance with various embodiments. However, such multi-layer fin 124 design features are not intended to be limiting beyond what is specifically recited in the claims that follow.

Referring still to FIG. 6A, the method 200 proceeds to an operation 212 by performing a CMP process on the tri-layer fin 124A. The CMP process may remove excessive material from third fin layer 130A and planarize a top surface of the tri-layer fin 124A.

Referring to FIG. 7A, the method 200 proceeds to an operation 214 by depositing a hard mask layer 114 on the tri-layer fin 124A. The hard mask layer 114 is used as an etch mask during the formation of the tri-layer fin 124A. The hard mask layer 114 may include any suitable material with etching selectivity, such as silicon oxide, silicon nitride, silicon carbide, silicon oxynitride, other suitable materials, and/or combinations thereof. In one embodiment, the hard mask layer 114 includes multiple films, such as silicon oxide and silicon nitride.

Referring to FIG. 7B, another embodiment of the semiconductor structure 100 is illustrated. In this embodiment, the method 200 proceeds to an operation 214 by depositing a hard mask layer 114 on the bi-layer fin 124B. In this embodiment, the operation 214 may incorporate detailed description of like structures from FIG. 7A without limitation.

Referring to FIG. 8A, the method 200 proceeds to an operation 216 by patterning the hard mask layer 114 to form a patterned hard mask layer 115. In some embodiments, the patterning process includes forming a patterned resist layer on the hard mask layer 114 by a lithography process and etching the hard mask layer 114 using the patterned resist layer as an etch mask. The patterned hard mask layer 115 defines a profile of the tri-layer fin 124A. A photoresist (or resist) layer used to define the profile of the tri-layer fin 124A may be formed on the hard mask layer 114. The resist layer includes a photosensitive material that causes the layer to undergo a property change when exposed to light, such as ultraviolet (UV) light, deep UV (DUV) light, or extreme UV (EUV) light. This property change can be used to selectively remove exposed or unexposed portions of the resist layer by a developing process. This procedure to form a patterned resist layer is also referred to as lithographic patterning or lithography process. In one embodiment, the resist layer is patterned to leave portions of the photoresist material disposed over the semiconductor structure 100 by the lithography patterning process. After patterning the resist layer, an etching process is performed on the semiconductor structure 100 to open the hard mask layer 114, thereby transferring the openings from the resist layer to the hard mask layer 114. The remaining resist layer may be removed after patterning the hard mask layer 114 by wet stripping or plasma ashing. In some examples, a lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the hard mask layer 114 may include wet etching, dry etching or a combination thereof. The etching process may include multiple etching steps.

Referring to FIG. 8B, another embodiment of the semiconductor structure 100 is illustrated. In this embodiment, the method 200 proceeds to an operation 216 by patterning the hard mask layer 114 to form a patterned hard mask layer 115. In this embodiment, the operation 216 may incorporate detailed description of like structures from FIG. 8A without limitation.

Figure 9A:
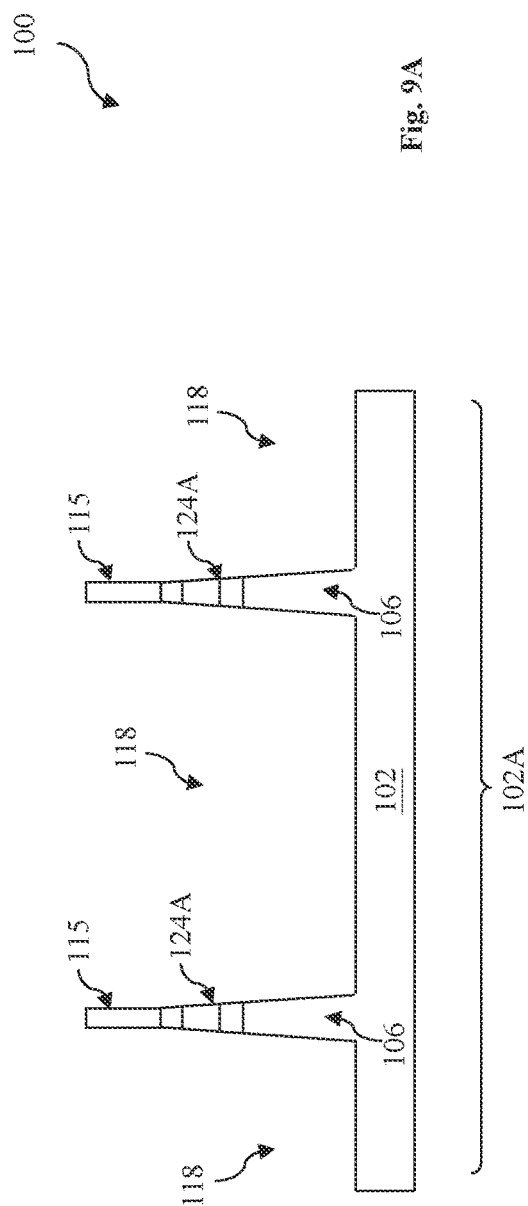

Referring to FIG. 9A, the method 200 proceeds to an operation 218 by etching the fin active region 106 to form the tri-layer fin 124A using the patterned hard mask layer 115 as an etch mask. The etching process forms trenches 118 in the semiconductor structure 100. The etching process may include any suitable etching technique such as dry etching, wet etching, and/or other etching methods (e.g., reactive ion etching (RIE)). In some embodiments, the etching process includes multiple etching steps with different etching chemicals, designed to etch the semiconductor structure 100 to form a trench 118 with certain trench profile for improved device performance and pattern density. In some examples, the semiconductor material of the fin active region 106 may be etched by a dry etching process using a fluorine-based etchant. Particularly, the etching process applied to the substrate is controlled such that the semiconductor substrate 102 is partially etched. This may be achieved by controlling etching time or by controlling other etching parameters. After the etching process, the fin active region 106 extends from the semiconductor substrate 102.

Figure 9B:
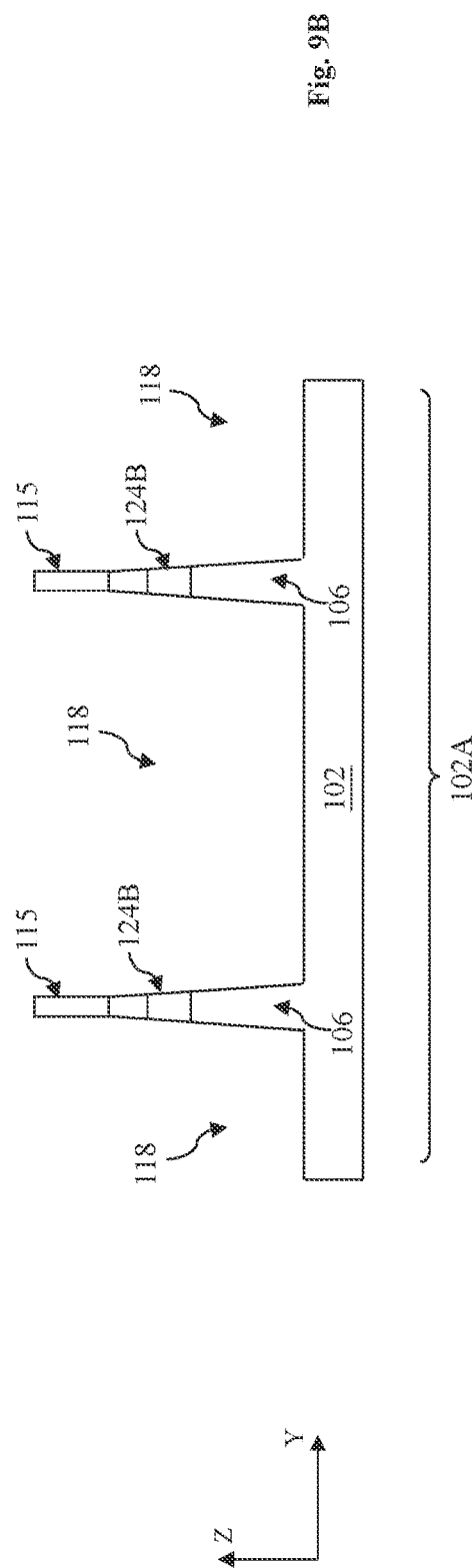

Referring to FIG. 9B, another embodiment of the semiconductor structure 100 is illustrated. In this embodiment, the method 200 proceeds to an operation 218 by etching the fin active region 106 to form the bi-layer fin 124B using the patterned hard mask layer 115 as an etch mask. In this embodiment, the operation 218 may incorporate detailed description of like structures from FIG. 9A without limitation.

Figure 9C:
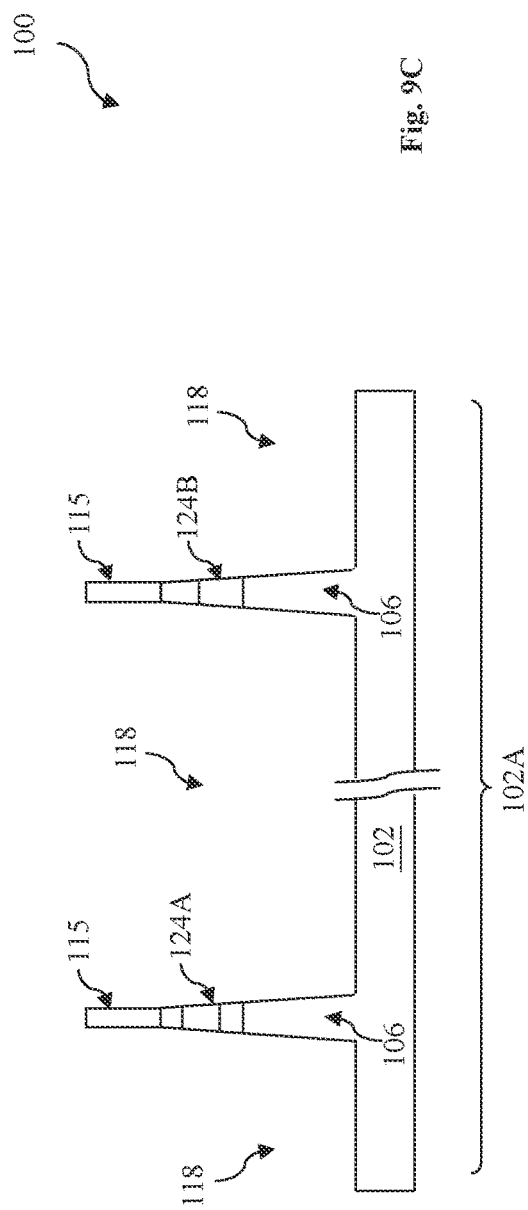

Referring to FIG. 9C, the tri-layer fin 124A and the bi-layer fin 124B are shown side-by-side for illustration purposes only and to facilitate understanding. This is not intended to be limiting beyond what is specifically recited in the claims that follow. It will be appreciated that the tri-layer fin 124A and the bi-layer fin 124B may be used separately or in combination with each other.

Figure 10:
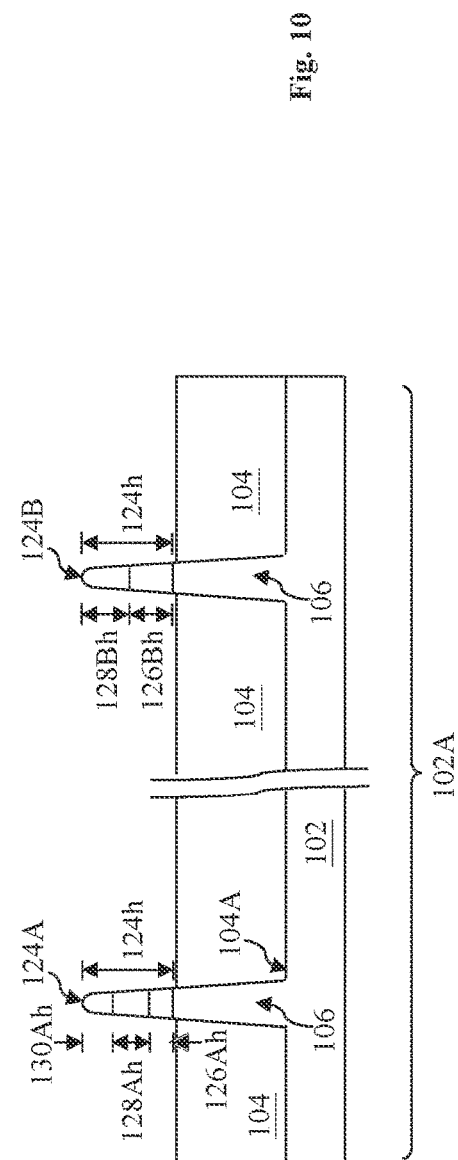

Referring to FIG. 10, the method 200 proceeds to an operation 220 by forming various STI features 104 in the trenches 118. In the operation 220, the STI features 104 are formed by filling the trenches 118 with one or more dielectric material. In the present embodiment, a lining material layer 104A, such as silicon nitride, is deposited by CVD or ALD on sidewalls and bottom surfaces of the trenches 118 to prevent oxidization of the fin active regions 106. Thereafter, one or more dielectric material is filled in the trenches 118 to form STI features 104. Suitable fill dielectric materials include semiconductor oxides, semiconductor nitrides, semiconductor oxynitrides, fluorinated silica glass (FSG), low-k dielectric materials, and/or combinations thereof. In various embodiments, the dielectric material is deposited using a high-density plasma CVD (HDP-CVD) process, a sub-atmospheric CVD (SACVD) process, a high-aspect ratio process (HARP), a flowable CVD (FCVD), and/or a spin-on process.

The operation 220 may further include a CMP process to remove the excessive dielectric material and planarize the top surface of the semiconductor structure 100. The CMP process may use the patterned hard mask layer 115 as a polishing stop layer to prevent polishing the fin active region 106 including the multi-layer fin structure 124. The operation 220 may further include an etching process to selectively recess the STI features 104 such that the fin active regions 106 are extruded above the top surface of the STI features 104. During the corresponding CMP process and etching process, the portions of the lining material layer 104A above the recessed STI features 104 are removed as well.

The hard mask layer 114 functions as an etch mask during the operation 218 and a polishing stop layer during the operation 220 to form the multi-layer fin 124 and the STI features 104. The operation 220 may further include removing the hard mask layer 114 by suitable CMP or etching processes.

Fin layer heights in the channel 119 are labeled in FIG. 10. In some embodiments, the tri-layer fin 124A includes the first fin layer 126A having height 126Ah, the second fin layer 128A having height 128Ah, and the third fin layer 130A having height 130Ah. The total height of the tri-layer fin 124A is 124$h$. In some other embodiments, the bi-layer fin 124B includes the first fin layer 126B having height 126Bh and the second fin layer 128B having height 128Bh. The total height of the bi-layer fin 124B is 124$h$. The respective heights of the foregoing layers and ratios of each layer height to total height listed above apply to all embodiments described herein.

In some embodiments, the multi-layer fin structure 124 has a profile like that shown in FIG. 10 where a width of the fin decreases from bottom to top and where a top surface of the multi-layer fin structure 124 is rounded. In other embodiments, the top surface may be square, like top surface shown in FIG. 9C covered by patterned hard mask layer 115. In some embodiments, a ratio of a first width at a top of the multi-layer fin structure 124 to a second width at a bottom of the multi-layer fin structure 124 may range from about 0.4 to 1.0 and even more particularly from about 0.4 to 0.6.

Referring to FIG. 11, the method 200 proceeds to an operation 222 by forming various dummy gates 120 on the fin active regions 106 and the STI features 104. In the present embodiment, the dummy gates 120 have elongated shapes and are oriented in the Y direction while the fin active regions 106 are oriented in the X direction. Each dummy gate 120 may be disposed over multiple fin active regions 106. In various embodiments, some dummy gates 120 or portions thereof are formed on the fin active regions 106 and some dummy gates 120 or portions thereof are formed on the STI features 104. In some embodiments, a dummy gate 120 may be disposed on an end of a fin active region 106 so that the dummy gate 120 is partially landing on the fin active region 106 and partially landing on the STI feature 104. In such embodiments, edges are configured to reduce edge effect and improve overall device performance.

The dummy gates 120 each may include polysilicon and may additionally include silicon oxide underlying the polysilicon. The formation of the dummy gates 120 includes depositing the gate materials (including polysilicon in the present example); and patterning the gate materials by a lithographic patterning and etching. A gate hard mask 122 may be formed on the gate materials and is used as an etch mask during the formation of the dummy gates 120. The gate hard mask 122 may include any suitable material with etching selectivity, such as silicon oxide, silicon nitride, silicon carbide, silicon oxynitride, other suitable materials, and/or combinations thereof. In one embodiment, the gate hard mask 122 includes multiple films, such as silicon oxide and silicon nitride. In some embodiments, the patterning process to form the dummy gates 120 includes forming a patterned resist layer on the gate hard mask 122 by lithography process; etching the gate hard mask 122 using the patterned resist layer as an etch mask; and etching the gate materials to form the dummy gates 120 using the patterned gate hard mask 122 as an etch mask.

One or more gate sidewall features (or spacers) 112 are formed on the sidewalls of the dummy gates 120 and the sidewalls of the fin active regions 106 as well. The spacers 112 may be used to offset the subsequently formed S/D features and may be used for constraining or modifying the S/D structure profile. The spacers 112 may include any suitable dielectric material, such as a semiconductor oxide, a semiconductor nitride, a semiconductor carbide, a semiconductor oxynitride, other suitable dielectric materials, and/or combinations thereof. The spacers 112 may have multiple films, such as two films (a silicon oxide film and a silicon nitride film) or three films (a silicon oxide film; a silicon nitride film; and a silicon oxide film). The formation of the spacers 112 includes deposition and anisotropic etching, such as dry etching.

The dummy gates 120 are configured in the fin active regions 106 for various FETs, therefore the corresponding FETs are also referred to as FinFETs. In the present examples, the FETs include p-type FETs within the first region 102A and n-type FETs within the second region 102B. In other examples, the FETs are configured to form a logic circuit, a memory circuit (such as one or more static random-access memory (SRAM) cells) or other suitable circuit.

Figure 12:
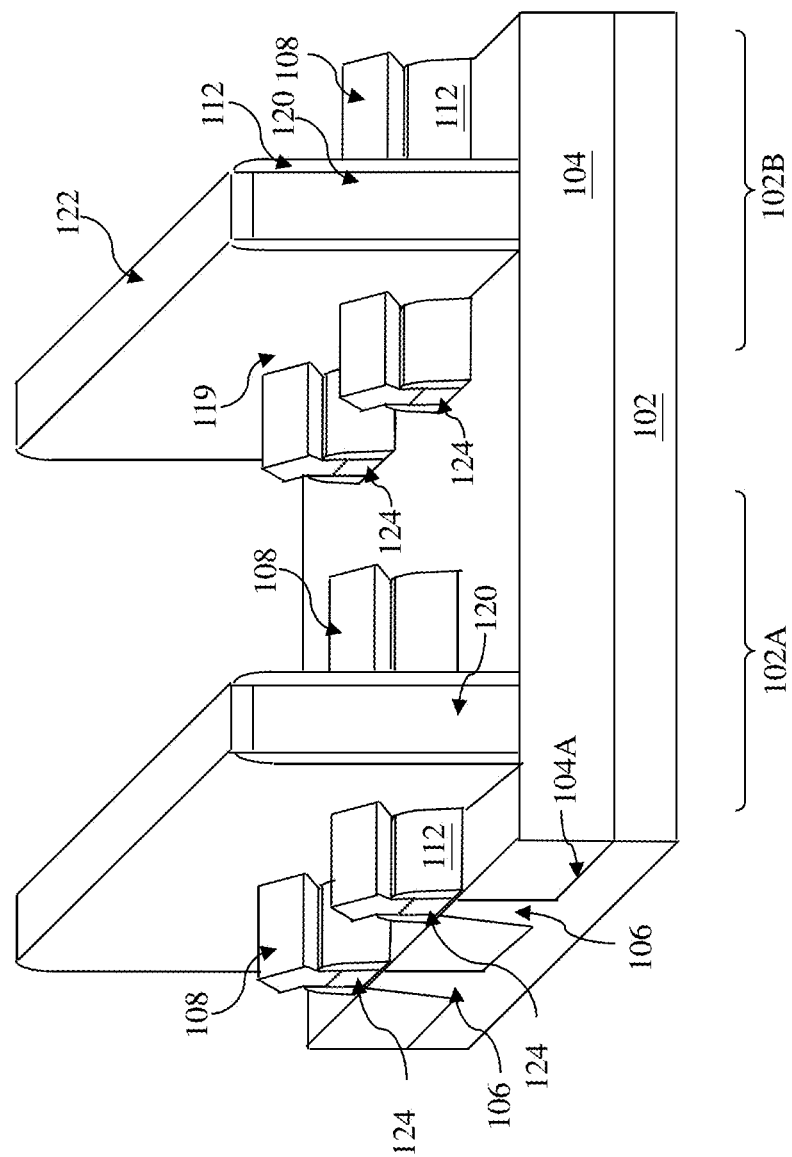
FIGS. 12, 13, and 14 are perspective views of a semiconductor structure at various fabrication stages constructed according to various embodiments.

Referring to FIG. 12, the method 200 proceeds to an operation 224 by forming various S/Ds 108 to respective FinFETs. The S/Ds 108 may include both light doped drain (LDD) features and heavily doped S/D. Each FET includes a S/D formed on the respective fin active region and interposed by the dummy gates 120. A channel 119 is formed in the fin active region in a portion that is underlying the dummy gate and spans between each S/D 108.

The raised S/Ds 108 may be formed by selective epitaxial growth for strain effect with enhanced carrier mobility and device performance. The dummy gates 120 and the spacers 112 constrain the S/Ds 108 to be selectively grown within the S/D regions with proper profile. In some embodiments, the S/Ds 108 are formed by one or more epitaxial (epi) processes, whereby Si features, SiGe features, SiC features, and/or other suitable features are grown in a crystalline state on the fin active regions 106. Alternatively, an etching process is applied to recess the S/D regions before the epitaxial growth. Suitable epitaxial processes include CVD deposition techniques (e.g., vapor-phase epitaxy (VPE) and/or ultra-high vacuum CVD (UHV-CVD), molecular beam epitaxy, and/or other suitable processes. The epitaxial process may use gaseous and/or liquid precursors, which interact with the composition of the fin structure 106. In some embodiments, adjacent S/Ds may be grown to merge together to provide increased contact area and reduce the contact resistance. This can be achieved by controlling the epitaxial growth process.

The S/Ds 108 may be in-situ doped during the epitaxial process by introducing doping species including: p-type dopants, such as boron or $BF_2$; n-type dopants, such as phosphorus or arsenic; and/or other suitable dopants including combinations thereof. If the S/Ds 108 are not in-situ doped, an implantation process is performed to introduce the corresponding dopant into the S/Ds 108. In an embodiment, the S/Ds 108 in an nFET include SiC or Si doped with phosphorous, while those in a pFET include Ge or SiGe doped with boron. In some other embodiments, the raised S/Ds 108 include more than one semiconductor material layers. For example, a silicon germanium layer is epitaxially grown on the substrate within the S/D regions and a silicon layer is epitaxially grown on the silicon germanium layer. One or more annealing processes may be performed thereafter to activate the S/Ds 108. Suitable annealing processes include rapid thermal annealing (RTA), laser annealing processes, other suitable annealing technique or a combination thereof.

The S/Ds 108 are disposed on both sides of the dummy gates 120. The channel 119 is underlying the corresponding gate stack 120 and is interposed between the corresponding S/D 108 with proper doping concentrations and doping profiles. For example, the channel 119 is p-type doped (or n-type doped) while the corresponding S/D 108 are n-type doped (or p-type doped). In one or more embodiments, the S/Ds 108 are unaffected by dopant, such as Ge, in the channel 119. In some embodiments, the S/Ds 108 are highly doped. The channel 119 may be formed through one or more steps to introduce suitable dopants, such as by ion implantation. The channel 119 includes the multi-layer fin structure 124 constructed according to various embodiments described herein.

Figure 13:
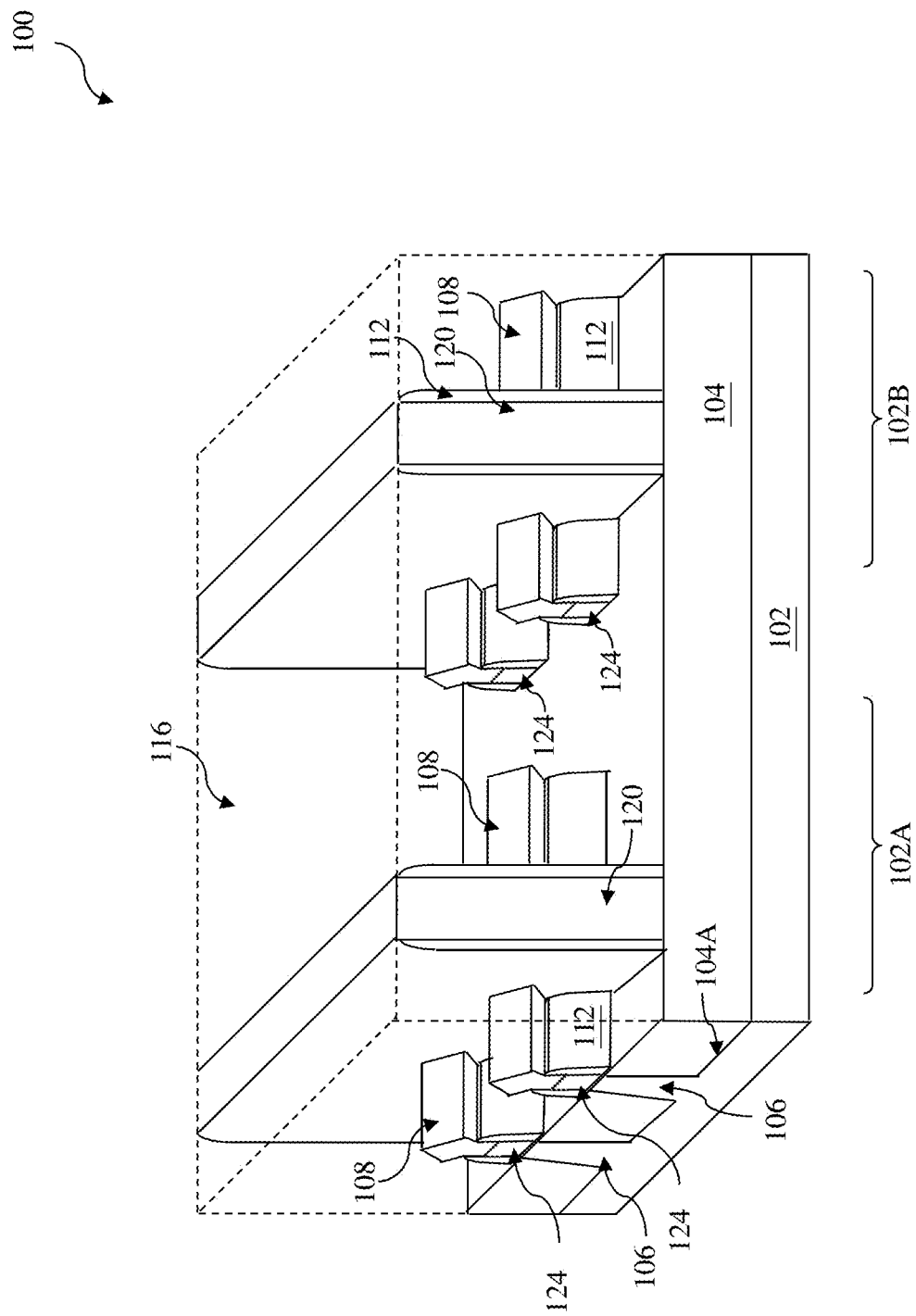

Referring to FIG. 13, the method 200 proceeds to an operation 226 by forming an ILD layer 116 on the semiconductor substrate 102, covering the S/Ds 108. The ILD layer 116 is drawn with dashed lines in FIG. 13 and is illustrated as being transparent to have a better view of other features (such as the fin active regions 106, multi-layer fins 124, the dummy gates 120, and the S/Ds 108) embedded in the ILD layer 116. The ILD layer 116 surrounds the dummy gates 120 allowing the dummy gates 120 to be removed and a replacement gate to be formed in the resulting cavity (also referred to as gate trench). Accordingly, in such embodiments, the dummy gates 120 are removed after the formation of the ILD layer 116. The ILD layer 116 is also a part of an electrical interconnect structure that electrically interconnects various devices of the semiconductor structure 100. In such embodiments, the ILD layer 116 acts as an insulator that supports and isolates the conductive traces. The ILD layer 116 may include any suitable dielectric material, such as a semiconductor oxide, a semiconductor nitride, a semiconductor oxynitride, other suitable dielectric materials, or combinations thereof. In some embodiments, the ILD layer 116 includes a low-k dielectric material (with a dielectric constant less than that of silicon oxide). The formation of the ILD layer 116 may include deposition and CMP to provide a planarized top surface. The hard mask 122 may be removed by the CMP process or by a subsequent etching process.

Figure 14:
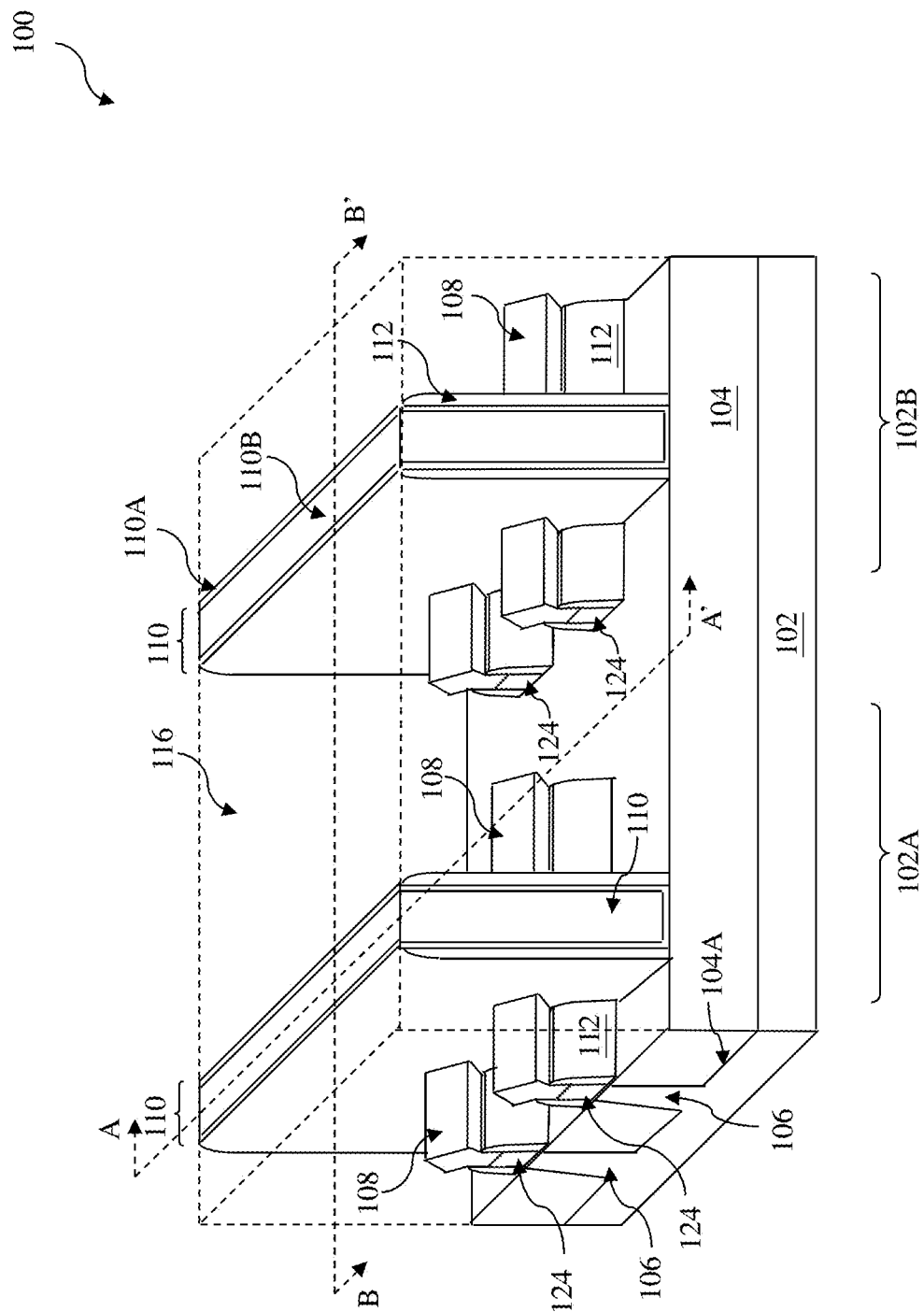

Referring to FIG. 14 in a perspective view, the method 200 proceeds to an operation 228 for gate replacement. The dummy gates 120 are removed and replaced by gate stacks 110 with high-k dielectric material and metal, therefore also referred to as high-k metal gate stacks 110. The gate replacement process may include etching, deposition and polishing. In the present embodiment, the dummy gates 120 are selectively removed by etching, resulting in gate trenches. Then the gate materials, such as high-k dielectric material and metal, are deposited in the gate trenches to form the high-k metal gate stacks 110. A CMP process is further implemented to polish and remove the excessive gate materials from the semiconductor structure 100.

The gate stacks 110 are formed in the gate trenches by a proper procedure, such as a gate-last process or a high-k-last process. Although it is understood that the gate stacks 110 may have any suitable gate structure and may be formed by any suitable procedure. A gate stack 110 is formed on the semiconductor substrate 102 overlying the channel 119 of the fin active region 106. The gate stacks 110 include a gate dielectric layer 110A and a gate electrode 110B disposed on the gate dielectric layer 110A. In the present embodiment, the gate dielectric layer 110A includes a high-k dielectric material and the gate electrode 110B includes metal or metal alloy. In some examples, the gate dielectric layer 110A and the gate electrode 110B each may include a number of sub-layers. The high-k dielectric material may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The gate electrode may include Ti, Ag, Al, TiAlN, TaC, TaCN, TaSiN, Mn, Zr, TiN, TaN, Ru, Mo, Al, WN, Cu, W, Ru, Co, or any suitable conductive materials. In some embodiments, different metal materials are used for nFET and pFET devices with respective work functions to enhance device performance.

FIG. 15A is a side section view along the dashed line AA' of the semiconductor structure 100 of FIG. 14, illustrating a tri-layer fin 124A constructed according to some embodiments. FIG. 16A is a side section view along the dashed line BB' of the semiconductor structure 100 of FIG. 14, illustrating the tri-layer fin 124A constructed according to some embodiments. Referring to FIGS. 15A and 16A, at operation 228, the gate replacement process may include forming a spacer 132 on a sidewall of the fin active region 106. The gate replacement process may further include forming a gate dielectric layer 110A over the fin active region 106 and the spacer 132. The gate replacement process may further include forming a gate electrode 110B over the gate dielectric layer 110A. In some embodiments, the gate dielectric layer 110A may include an interfacial layer 134 over the tri-layer fin 124A. In some embodiments, the gate dielectric layer 110A may also include a high-k dielectric material layer 136 over the interfacial layer 134 and the spacer 132. The interfacial layer 134 may include silicon oxide, silicon nitride, silicon oxynitride, and/or other suitable material. The interfacial layer 134 may be deposited by a suitable method, such as ALD, CVD, ozone oxidation, etc. The high-k dielectric layer 136 may be deposited on the interfacial layer 134 (if the interfacial layer is present) by a suitable technique, such as ALD, CVD, metal-organic CVD (MOCVD), PVD, thermal oxidation, combinations thereof, and/or other suitable techniques.

FIG. 15B is a side section view along the dashed line AA' of the semiconductor structure 100 of FIG. 14, illustrating a bi-layer fin 124B constructed according to some embodiments. FIG. 16B is a side section view along the dashed line BB' of the semiconductor structure 100 of FIG. 14, illustrating the bi-layer fin 124B constructed according to some embodiments. Referring to FIGS. 15B and 16B, at operation 228 the gate replacement process may include forming the spacer 132, the gate dielectric layer 110A, and the gate electrode 110B. In this embodiment, the operation 228 may incorporate detailed description of like structures from FIGS. 15A and 16A without limitation.

As shown in FIGS. 16A and 16B, a lateral interface or boundary region may be formed between each S/D 108 and each multi-layer fin structure 124. In some embodiments, the interface may have low sensitivity to fin structure meaning that the interface and value of Vt associated with the interface may be substantially unchanged for the multi-layer fin structure 124 compared to a single-layer fin.

Figure 17C:
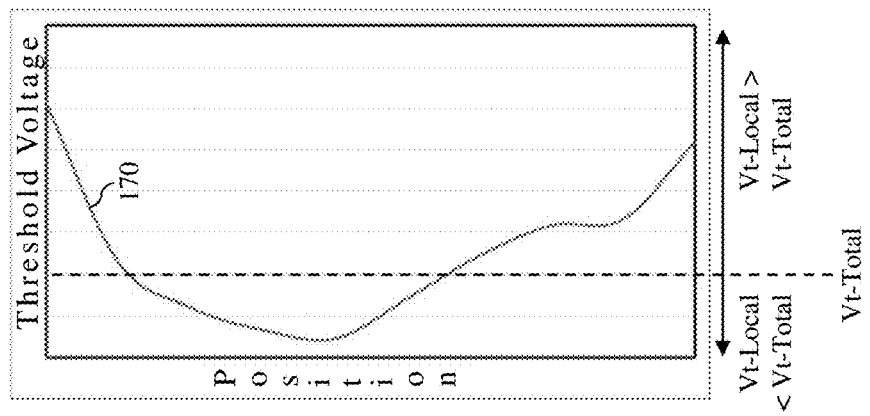
FIGS. 17B and 17C are plots of Vt vs. position for representative bi-layer and single layer fins, respectively, illustrating Vt distribution along the respective fin profiles according to some embodiments.
Figure 17B:
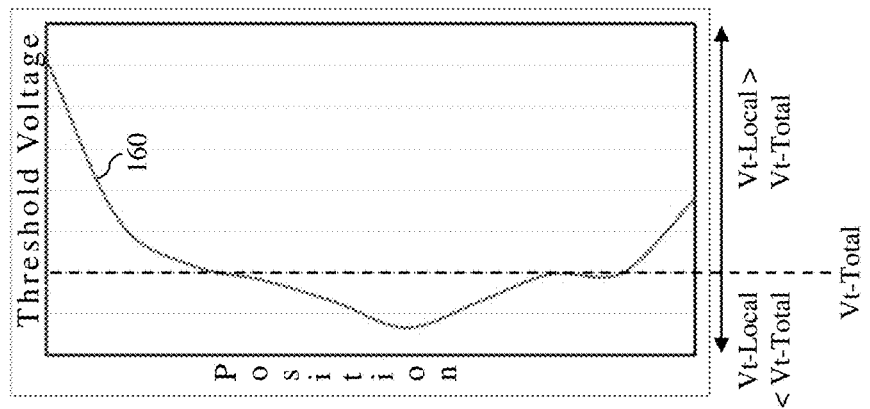
Figure 17A:
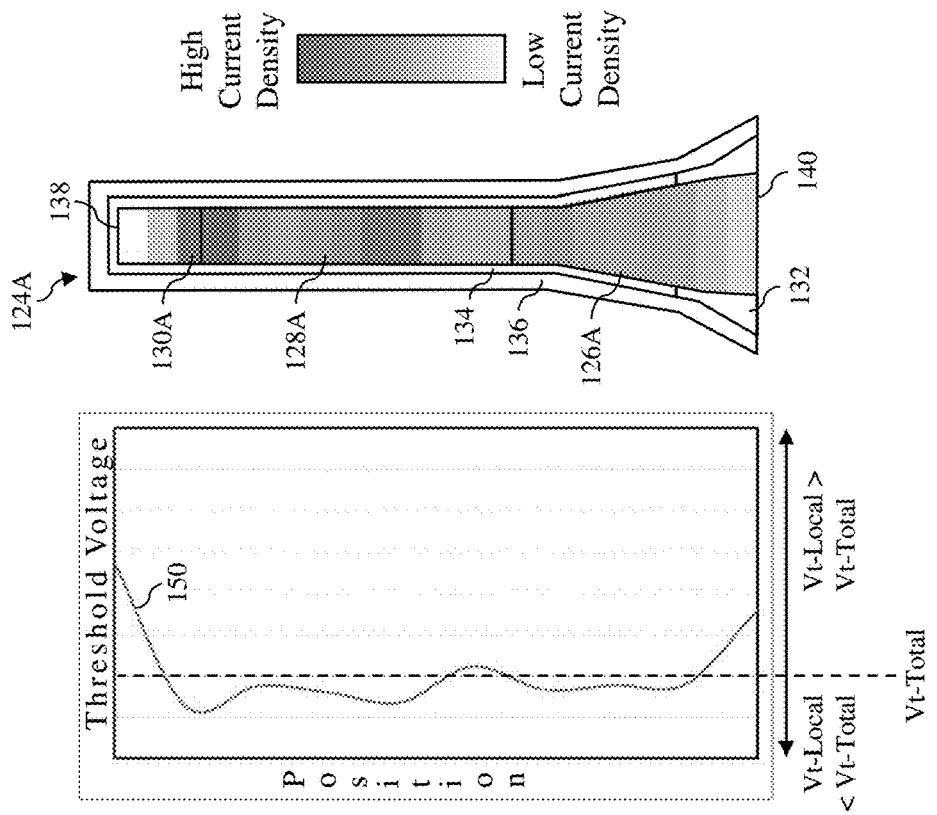
FIG. 17A includes a plot of Vt vs. position and a current density heat map corresponding thereto for a representative tri-layer fin illustrating Vt distribution and current density along the fin profile according to some embodiments.

FIG. 17A is a plot of threshold voltage (Vt) vs. position for a representative tri-layer fin 124A illustrating Vt distribution along the fin profile (represented by line 150). The plot shows vertical position along the vertical axis and Vt along the horizontal axis. In particular, line 150 illustrates Vt-Local at various positions along the fin profile, where Vt-Local represents a measured or calculated Vt value at each position. On the other hand, Vt-Total represents total or effective Vt measured for the entire tri-layer fin 124A. Vt-Total is represented by a vertical dashed line. As labeled at bottom, portions of line 150 to the left of Vt-Total have Vt-Local less than Vt-Total, and portions of line 150 to the right of Vt-Total have Vt-Local greater than Vt-Total. Naturally, points on line 150 intersecting Vt-Total have Vt-Local equal to Vt-Total. In some embodiments, improving Vt distribution may involve reducing overall deviation between line 150 and Vt-Total so that Vt-Local more uniformly matches Vt-Total along the fin profile. In some embodiments, line 150 depicts a favorable Vt distribution having limited deviation from and generally centered around Vt-Total.

FIG. 17A also includes a heat map of current density corresponding to the foregoing Vt distribution. For illustrative purposes, the heat map is shown over a side section view of the tri-layer fin 124A. The heat map illustrates variation in current density vs. position according to a scale ranging in color from dark gray for relatively higher current density to white representing relatively lower current density. As shown in FIG. 17A, Vt and current density are inversely related, meaning as Vt increases, for example going toward a top 138 of the tri-layer fin 124A, current density decreases as illustrated by lighter shading in the heat map. Likewise, as Vt decreases, for example going away from a base 140 of the tri-layer fin 124A, current density increases as illustrated by darker shading in the heat map. In some embodiments, the current density heat map depicts a favorable current density distribution having a high degree of color uniformity and generally centered around a middle of the scale.

FIG. 17B is a plot of Vt vs. position for a representative bi-layer fin 124B illustrating Vt distribution along the fin profile (represented by line 160). In some embodiments, line 160 depicts a Vt distribution that is less favorable than the Vt distribution depicted by line 150 for the tri-layer fin 124A. Namely, line 160 has increased deviation from Vt-Total compared to line 150.

FIG. 17C is a plot of Vt vs. position for a representative single layer fin illustrating Vt distribution along the fin profile (represented by line 170). In some embodiments, line 170 depicts a Vt distribution that is less favorable than the Vt distributions depicted by lines 150 and 160 for the tri-layer fin 124A and bi-layer fin 124B, respectively. Namely, line 170 has increased deviation from Vt-Total compared to lines 150 and 160.

A height of each fin layer relative to total fin height is of critical importance in eliminating or reducing the Vt distribution and current density issue described above. As described herein, using few layers, in some embodiments less than or equal to five layers, for example three layers in the tri-layer fin 124A or two layers in the bi-layer 124B, can reduce manufacturing cost and complexity. However, this may limit ability to improve or optimize Vt distribution based on fin material composition and dopant properties alone. In this case, ratio of fin layer height to total height is an important and critical design feature. The importance of fin layer height can be illustrated using the Vt distribution plots described above. In some embodiments, a baseline condition for Vt distribution can established corresponding to the representative single layer fin represented by line 170 in FIG. 17C. Starting at bottom, a first portion of line 170 (and thus a first portion of the single layer fin) has Vt-Local greater than Vt-Total. Moving upward, after line 170 crosses the dashed line representing Vt-Total, a second portion of the single layer fin has Vt-Local less than Vt-Total, and after line 170 crosses the dashed line a second time, a third portion of the single layer fin once again has Vt-Local greater than Vt-Total, like the first portion.

It follows that to improve Vt distribution above the baseline condition, a multi-layer fin structure 124 may be constructed having three layers, such as the tri-layer fin 124A represented by line 150 in FIG. 17A, where each layer has composition different than each adjacent layer. Furthermore, as illustrated by the side section view of the tri-layer, a height (126Ah, 128Ah, 130Ah) of each layer (126A, 128A, 130A) may be constructed so that each interface between adjacent layers corresponds to a position where line 150 crosses Vt-Total. Such design strategy may be adapted to other multi-layer fin structures 124 having any number of layers greater than one. In some embodiments, multi-layer fin structures 124 may range, more particularly, from two to five layers.

Based on experimentation, it has been determined that the foregoing fin layer heights described with reference to the tri-layer fin 124A and bi-layer fin 124B are critical to addressing the Vt distribution and current density issue. Regarding the tri-layer fin 124A, critical ranges may include the height 126Ah of the first fin layer 126A being 25-35% of the total height 124$h$, the height 128Ah of the second fin layer 128A being 40-60% of the total height 124$h$, and the height 130Ah of the third fin layer 130A being 15-25% of the total height 124$h$. Regarding the bi-layer fin 124B, critical ranges may include the height 126Bh of the first fin layer 126B being 30-60% of the total height 124$h$ and the height 128Bh of the second fin layer 128B being 40-70% of the total height 124$h$.

The method 200 may include other fabrication processes 230 implemented before, during or after the operations described above. For example, the method 200 may include an operation to form a protection layer on top of the gate stacks 110 to protect the gate stacks 110 from loss during subsequent processing. The protection layer may include a suitable material different from the dielectric material of ILD layers to achieve etching selectivity during the etching process to form contact openings. In some embodiments, the protection layer includes silicon nitride. In other examples, the method 200 includes forming an interconnection structure on the semiconductor substrate 102 to connect various FETs and other devices into a circuit. The interconnection structure includes contacts, vias and metal lines through a suitable process. In the copper interconnection, the conductive features include copper and may further include a barrier layer. The copper interconnect structure is formed by a damascene process. A damascene process includes depositing an ILD layer; patterning the ILD layer to form trenches; depositing various materials (such as a barrier layer and copper); and performing a CMP process. A damascene process may be a single damascene process or a dual damascene process. The deposition of the copper may include PVD to form a seed layer and plating to form bulk copper on the copper seed layer. Other metals, such as ruthenium, cobalt, tungsten or aluminum, may be used to form the interconnection structure. In some embodiments, prior to filling conductive material in contact holes, silicide may be formed on the S/Ds 108 to further reduce the contact resistance. The silicide includes silicon and metal, such as titanium silicide, tantalum silicide, nickel silicide or cobalt silicide. The silicide may be formed by a process referred to as self-aligned silicide (or salicide). The process includes metal deposition, annealing to react the metal with silicon, and etching to remove unreacted metal. In some other embodiments, some other metal, such as ruthenium or cobalt, may be used for contacts and/or vias.

The present disclosure provides a semiconductor structure having FinFETs and a method of making the same to reduce Vt distribution and current density issue. In the disclosed method, a multi-layer fin is formed on the substrate. The semiconductor structure includes a semiconductor substrate; a fin extending above the semiconductor substrate, wherein the fin includes a first layer over the semiconductor substrate and a second layer over the first layer, wherein the first layer includes silicon germanium having a first concentration of germanium, and wherein the second layer includes silicon germanium having a second concentration of germanium less than the first concentration of germanium; and a gate stack disposed over the fin.

Thus, the present disclosure provides a method for fabricating a semiconductor structure in accordance with some embodiments. The method includes forming a first fin layer on a semiconductor substrate, wherein the first fin layer includes silicon germanium having a first concentration of germanium; forming a second fin layer over the first fin layer, wherein the second fin layer includes silicon germanium having a second concentration of germanium less than the first concentration of germanium; and patterning the semiconductor substrate to form a fin.

The present disclosure provides a semiconductor structure in accordance with some embodiments. The semiconductor structure includes a semiconductor substrate; a fin extending above the semiconductor substrate, wherein the fin includes: a first layer over the semiconductor substrate, the first layer including a silicon-containing compound semiconductor having a dopant at a first concentration; a second layer over the first layer, the second layer including the silicon-containing compound semiconductor having the dopant at a second concentration less than the first concentration; and a third layer over the second layer, the third layer including the silicon-containing compound semiconductor having the dopant at the first concentration; and a gate stack disposed over the fin.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure comprising:
   a semiconductor substrate;
   a fin extending above the semiconductor substrate, wherein the fin includes a first layer over the semiconductor substrate and a second layer over the first layer, wherein the first layer includes silicon germanium having a first concentration of germanium, and wherein the second layer includes silicon germanium having a second concentration of germanium less than the first concentration of germanium; and
   a gate stack disposed over a top surface of the fin.

2. The semiconductor structure of claim 1, wherein the fin has a total height and wherein the first layer is 30-60% of the total height.

3. The semiconductor structure of claim 2, wherein the second layer is 40-70% of the total height.

4. The semiconductor structure of claim 1, wherein the second concentration is 10-30% germanium and wherein the first concentration is 3-5% greater than the second concentration.

5. The semiconductor structure of claim 1, further comprising a third layer over the second layer, wherein the third layer includes silicon germanium having a third concentration of germanium greater than the second concentration of germanium.

6. The semiconductor structure of claim 5, wherein the fin has a total height and wherein the first layer is 25-35% of the total height.

7. The semiconductor structure of claim 6, wherein the second layer is 40-60% of the total height.

8. The semiconductor structure of claim 7, wherein the third layer is 15-25% of the total height.

9. The semiconductor structure of claim 5, wherein the second concentration is 10-30% germanium and wherein the first and third concentrations are 3-5% greater than the second concentration.

10. The semiconductor structure of claim 5, wherein the first and third concentrations are within 1% of each other.

11. A method of forming an integrated circuit structure comprising:
    forming a first fin layer on a semiconductor substrate, wherein the first fin layer includes silicon germanium having a first concentration of germanium;
    forming a second fin layer over the first fin layer, wherein the second fin layer includes silicon germanium having a second concentration of germanium less than the first concentration of germanium;
    patterning the first fin layer and the second fin layer to form a fin;
    forming a dummy gate stack over a channel region of the fin;
    after the forming of the dummy gate stack, etching a source/drain region of the fin to form a recess, the source/drain region being adjacent the channel region;
    forming a source/drain feature over the recess; and
    replacing the dummy gate stack with a gate stack.

12. The method of claim 11, wherein the first and second fin layers are formed through an epitaxial growth process.

13. The method of claim 11, further comprising treating the first and second fin layers by ion implantation to introduce dopant.

14. The method of claim 11 further comprising forming a third fin layer over the second fin layer, wherein the third fin layer includes silicon germanium having a third concentration of germanium greater than the second concentration of germanium.

15. A semiconductor structure comprising:
    a semiconductor substrate;
    a fin extending above the semiconductor substrate and lengthwise along a direction, wherein the fin includes:
      a first layer over the semiconductor substrate, the first layer including a silicon-containing compound semiconductor having a dopant at a first concentration;
      a second layer over the first layer, the second layer including the silicon-containing compound semiconductor having the dopant at a second concentration less than the first concentration; and
      a third layer over the second layer, the third layer including the silicon-containing compound semiconductor having the dopant at the first concentration;
    a gate stack disposed over a channel region of the fin;
    a source feature disposed over a source region of the fin; and
    a drain feature disposed over a drain region of the fin,
    wherein the channel region is disposed between the source feature and the drain feature along the direction.

16. The semiconductor structure of claim 15, wherein the dopant is germanium.

17. The semiconductor structure of claim 15, wherein the fin has a total height and wherein the first layer is 25-35% of the total height.

18. The semiconductor structure of claim 17, wherein the second layer is 40-60% of the total height.

19. The semiconductor structure of claim 17, wherein the third layer is 15-25% of the total height.

20. The semiconductor structure of claim 15, wherein the second concentration is 10-30% and the first concentration is 3-5% greater than the second concentration.

* * * * *